(12) United States Patent
Chung et al.

(10) Patent No.: US 10,825,598 B2
(45) Date of Patent: Nov. 3, 2020

(54) PLANAR MAGNETIC ELEMENT

(71) Applicant: FAIRCHILD KOREA SEMICONDUCTOR LTD., Bucheon-si (KR)

(72) Inventors: Bonggeun Chung, Incheon (KR); SangCheol Moon, Daejeon (KR); Gwanbon Koo, Bucheon-si (KR)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 70 days.

(21) Appl. No.: 15/145,079

(22) Filed: May 3, 2016

(65) Prior Publication Data

US 2016/0336106 A1 Nov. 17, 2016

Related U.S. Application Data

(60) Provisional application No. 62/160,916, filed on May 13, 2015.

(51) Int. Cl.
| | |
|---|---|
| *H01F 27/29* | (2006.01) |
| *H01F 5/00* | (2006.01) |
| *H01F 27/28* | (2006.01) |
| *H01F 17/00* | (2006.01) |
| *H01F 17/04* | (2006.01) |
| *H03H 1/00* | (2006.01) |

(52) U.S. Cl.
CPC ..... *H01F 27/2804* (2013.01); *H01F 17/0013* (2013.01); *H01F 17/04* (2013.01); *H01F 2027/2809* (2013.01); *H01F 2027/2819* (2013.01); *H03H 1/0007* (2013.01); *H03H 2001/0092* (2013.01)

(58) Field of Classification Search
CPC ......... H01F 27/2804; H01F 2027/2809; H01F 2027/2819
USPC ......................................... 336/192, 200, 232
See application file for complete search history.

(56) References Cited

U.S. PATENT DOCUMENTS

| | | | | |
|---|---|---|---|---|
| 4,803,609 | A * | 2/1989 | Gillett | H02M 3/28 323/305 |
| 5,184,103 | A * | 2/1993 | Gadreau | H01F 27/2804 336/180 |
| 5,615,091 | A * | 3/1997 | Palatnik | H01F 19/08 336/198 |
| 5,750,951 | A * | 5/1998 | Kaneko | B23H 1/02 219/69.12 |
| 6,420,953 | B1 * | 7/2002 | Dadafshar | H01F 27/027 336/200 |
| 6,903,938 | B2 * | 6/2005 | Waffenschmidt | H05K 1/165 336/200 |

(Continued)

*Primary Examiner* — Alexander Talpalatski
*Assistant Examiner* — Joselito S. Baisa
(74) *Attorney, Agent, or Firm* — AMPACC Law Group, PLLC

(57) ABSTRACT

A planar magnetic element includes a pair of cores, a first winding layer disposed between the pair of cores and including a first winding coupled between a first terminal and a second terminal, and a plurality of second winding layers disposed between the pair of cores and including second windings coupled between a third terminal and a fourth terminal, wherein the first winding layer may be disposed between the plurality of second winding layers.

12 Claims, 17 Drawing Sheets

(56) References Cited

U.S. PATENT DOCUMENTS

| | | | | |
|---|---|---|---|---|
| 6,972,656 | B2* | 12/2005 | Takeshima | H02M 3/3376 336/180 |
| 7,123,121 | B2* | 10/2006 | Park | H01F 27/367 336/84 C |
| 7,256,675 | B2* | 8/2007 | Chen | H01F 27/38 336/180 |
| 7,292,126 | B2* | 11/2007 | So | H01F 27/2804 29/602.1 |
| 7,489,220 | B2* | 2/2009 | Baumgartner | H01F 17/0006 336/200 |
| 7,859,382 | B2* | 12/2010 | Koprivnak | H01F 27/2804 336/170 |
| 7,889,041 | B2* | 2/2011 | Minteer | H01F 27/2804 336/200 |
| 8,023,294 | B2* | 9/2011 | Ryan | H02M 1/14 323/335 |
| 8,487,734 | B2* | 7/2013 | Tanabe | H01L 23/5227 336/222 |
| 8,786,393 | B1* | 7/2014 | Chen | H01F 19/08 336/173 |
| 9,105,381 | B2* | 8/2015 | Girard | H01F 5/003 |
| 9,147,513 | B2* | 9/2015 | Song | H03H 7/1758 |
| 9,576,720 | B2* | 2/2017 | de Groot | H01F 27/385 |
| 2004/0032313 | A1* | 2/2004 | Ferencz | H01F 27/266 336/200 |
| 2005/0128038 | A1* | 6/2005 | Hyvonen | H01F 17/0013 336/182 |
| 2008/0024250 | A1* | 1/2008 | Park | H01F 37/00 333/24 C |
| 2008/0092865 | A1* | 4/2008 | Aida | F02P 3/0554 123/594 |
| 2009/0051476 | A1* | 2/2009 | Tada | H01F 17/0013 336/105 |
| 2009/0212754 | A1* | 8/2009 | Ryan | H02M 1/14 323/282 |
| 2009/0295528 | A1* | 12/2009 | Silva | H01F 3/10 336/200 |
| 2010/0060255 | A1* | 3/2010 | Ouyang, Jr. | H01F 27/2885 323/355 |
| 2010/0079233 | A1* | 4/2010 | Koprivnak | H01F 27/2804 336/200 |
| 2010/0127815 | A1* | 5/2010 | Damnjanovic | H01F 27/289 336/84 C |
| 2010/0295528 | A1* | 11/2010 | Park | G05F 3/16 323/312 |
| 2011/0140824 | A1* | 6/2011 | Herhold | H01F 27/2804 336/200 |
| 2011/0227688 | A1* | 9/2011 | Park | H01F 27/2804 336/200 |
| 2011/0316658 | A1* | 12/2011 | Liu | H01F 17/0013 336/200 |
| 2013/0335927 | A1* | 12/2013 | Boone | A61N 1/3981 361/748 |
| 2014/0077648 | A1* | 3/2014 | Brauer | H02K 3/26 310/152 |
| 2014/0167901 | A1* | 6/2014 | Persson | H01F 27/323 336/200 |
| 2014/0292471 | A1* | 10/2014 | Ho | H01F 27/385 336/84 C |
| 2014/0368308 | A1* | 12/2014 | Boone | A61N 1/3981 336/200 |
| 2015/0130579 | A1* | 5/2015 | Kim | H01F 27/2804 336/200 |

* cited by examiner

PLANAR MAGNETIC ELEMENT

CROSS-REFERENCE TO RELATED APPLICATIONS

This application claims priority from U.S. Provisional Application No. 62/160,916, filed on May 13, 2015 with the United States Patent and Trademark Office, the entire contents of which are incorporated herein by reference.

BACKGROUND

(a) Technical Field

Embodiments relate to a planar magnetic element.

(b) Description of the Related Art

A switching mode power supply (SMPS) stably provides power using a switching element such as a metal oxide semiconductor field effect transistor (MOSFET), a bipolar junction transistor (BJT), etc. and a transformer.

Recently, as electronic devices are being miniaturized and thinned, cases in which a planar magnetic element such as a planar transformer, a planar inductor, etc. is applied to an SMPS are increasing. A planar magnetic element is manufactured by stacking small printed circuit boards and has an advantage of being able to be miniaturized compared to a wound magnetic element.

Electromagnetic interference (EMI) noise is one important factor that determines quality of an electronic device. There is a problem in that it is difficult to apply a method of shielding EMI noise that has been applied to a conventional wound magnetic element to a planar magnetic element due to its structural characteristics.

SUMMARY

Embodiments of the present disclosure are directed to providing a planar magnetic element capable of effectively reducing EMI noise.

A planar magnetic element coupled to a switch according to a first embodiment includes a pair of cores, a first winding layer disposed between the pair of cores and including a first winding coupled between a first terminal and a second terminal, and a plurality of second winding layers disposed between the pair of cores and including second windings coupled between a third terminal and a fourth terminal, wherein the first winding layer may be disposed between the plurality of second winding layers, and the first terminal may be coupled to the switch.

In the planar magnetic element according to the first embodiment, the second windings included in the plurality of second winding layers may be coupled to each other in parallel.

In the planar magnetic element according to the first embodiment, the second windings included in the plurality of second winding layers may be coupled to each other in series.

The planar magnetic element according to the first embodiment may further include at least one third winding layer in which a third winding coupled between the first winding and the second terminal is disposed, and the first winding may be wound in a smaller number of turns than the third winding.

In the planar magnetic element according to the first embodiment, the first winding layer may further include a third winding disposed at an outside of the first winding, and the third winding may be coupled to the second winding.

In the planar magnetic element according to the first embodiment, the first winding layer may further include a third winding disposed at an outside of the first winding, and the third winding may be coupled to a ground.

In the planar magnetic element according to the first embodiment, the first winding layer may further include a flux band pattern disposed at an inside of the first winding.

In the planar magnetic element according to the first embodiment, the third terminal and the fourth terminal may be ground terminals.

A planar magnetic element coupled to a switch according to a second embodiment includes a pair of cores, a first winding layer disposed between the pair of cores and in which a first winding including one end coupled to a first terminal and a second winding including one end coupled to a second terminal are disposed, and a second winding layer disposed between the pair of cores and in which a third winding coupled between the other end of the first winding and the other end of the second winding is disposed, wherein the second winding may be disposed at an outside of the first winding, and the first terminal may be coupled to the switch.

In the planar magnetic element according to the second embodiment, the first winding layer may further include a fourth winding disposed at an outside of the second winding and coupled between a third terminal and a fourth terminal.

The planar magnetic element according to the second embodiment may further include a plurality of third winding layers in which a fifth winding coupled to the fourth winding is disposed, and the first winding layer and the second winding layer may be disposed between the plurality of third winding layers.

The planar magnetic element according to the second embodiment may further include a third winding layer disposed between the pair of cores and including a fourth winding coupled between a third terminal and a fourth terminal.

A planar magnetic element coupled to a switch according to a third embodiment includes a pair of cores, a first winding layer disposed between the pair of cores and in which a first winding including one end coupled to a first terminal is disposed, and a plurality of second winding layers disposed between the pair of cores and in which second windings coupled between the other end of the first winding and a second terminal are disposed, wherein the first winding layer may be disposed between the plurality of second winding layers, and the first terminal may be coupled to the switch.

In the planar magnetic element according to the third embodiment, the second windings disposed in the plurality of second winding layers may be coupled to each other in series.

In the planar magnetic element according to the third embodiment, the second windings may be wound in smaller numbers of turns than the first winding.

In the planar magnetic element according to the third embodiment, the second windings may have larger winding widths than the first winding.

In the planar magnetic element according to the third embodiment, the second windings disposed in the plurality of second winding layers may be coupled to each other in parallel.

The planar magnetic element according to the third embodiment may further include at least one third winding layer disposed between the pair of cores and in which a third winding coupled between the first winding and the second windings is disposed, and the at least one third winding layer may be disposed between any one of the plurality of second winding layers and the first winding layer.

The planar magnetic element according to the third embodiment may further include a third winding layer disposed between the pair of cores and in which a third winding coupled between a third terminal and a fourth terminal is disposed.

A planar magnetic element coupled to a switch according to a fourth embodiment includes a pair of cores, and a first winding layer disposed between the pair of cores and in which a first winding coupled between a first terminal and a second terminal and a second winding coupled between a third terminal and a fourth terminal are disposed, wherein the second winding may be disposed at an outside of the first winding, and the first terminal may be coupled to the switch.

In the planar magnetic element according to the fourth embodiment, the third terminal and the fourth terminal may be coupled to a ground.

The planar magnetic element according to the fourth embodiment may further include a second winding layer disposed between the pair of cores and in which a third winding coupled between the second terminal and the first winding is disposed, and the first winding may be wound in a smaller number of turns than the third winding.

The planar magnetic element according to the fourth embodiment may further include a third winding layer disposed between the pair of cores and including a third winding coupled between the third terminal and the fourth terminal.

A planar magnetic element coupled to a switch according to a fifth embodiment includes a pair of cores, and a first winding layer disposed between the pair of cores and in which a flux band pattern and a first winding coupled between a first terminal and a second terminal are disposed, wherein the flux band pattern may be disposed at an inside of the first winding, and the first terminal may be coupled to the switch.

The planar magnetic element according to the fifth embodiment may further include a second winding layer disposed between the pair of cores and including a second winding coupled between a third terminal and a fourth terminal.

A planar magnetic element capable of effectively reducing EMI noise is provided in the embodiments.

DETAILED DESCRIPTION OF THE EMBODIMENTS

Figure 1:
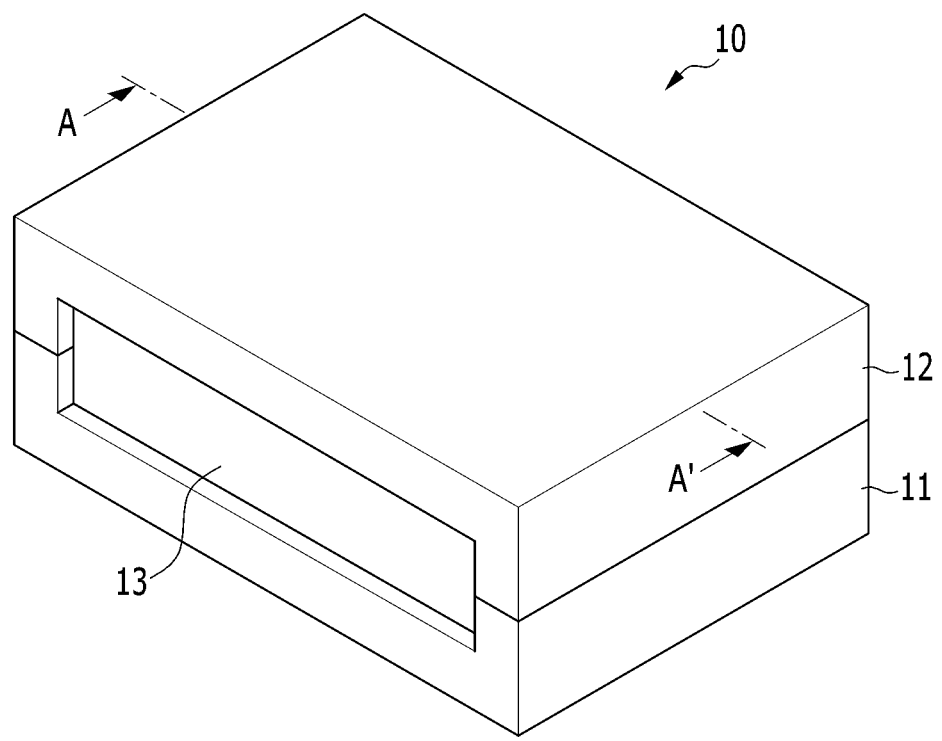
FIGS. 1 and 2 are views schematically illustrating a planar magnetic element according to embodiments.

Hereinafter, the present disclosure will be described in detail with reference to the accompanying drawings to enable those of ordinary skill in the art to which the present disclosure pertains to easily execute the present disclosure. However, embodiments of the present disclosure may be implemented in various different forms and are not limited to the embodiments described herein. Also, in order to clearly describe the present disclosure, parts unrelated to the description have been omitted from the drawings, and like reference numerals are given to like parts throughout the specification.

In addition, since the size and the thickness of each element shown in the drawings are randomly shown for convenience of the description, the present disclosure is not necessarily limited to those illustrated.

To clearly express several layers and regions, the thicknesses have been enlarged in the drawings. In addition, for convenience of the description, the thicknesses of some layers and regions have been exaggerated in the drawings. When it is said that a part such as a layer, a film, a region, or a plate is "above" or "over" another part, both a case in which the part is "directly above" the other part and a case in which still another part is present between the part and the other part are included.

In addition, throughout the specification, when it is said that a certain part "includes" a certain element, this does not exclude other elements from being included but the certain part may further include another element unless particularly described otherwise. In addition, throughout the specification, something that is "on" a target part may be disposed above or below a target part, and is not necessarily disposed at an upper side with respect to the direction of gravity.

In addition, throughout the specification, when it is said that a certain part is "connected" to another part, this includes a case in which the certain part and the other part are "directly connected" as well as a case in which the certain part and the other part are "electrically connected" while having another element therebetween. In addition, when it is said that a certain part "includes" a certain element, this does not exclude other elements from being included but the certain part may further include another element unless particularly described otherwise.

In addition, throughout the specification, terms including ordinals such as "first" and "second" may be used in describing various elements, but the elements are not limited by the terms. The terms are used only for the purpose of differentiating one element from another element. For example, a second element may be referred to as a first element, and likewise, a first element may be referred to as a second element while not departing from the scope of the present disclosure.

Hereinafter, a planar magnetic element according to embodiments will be described in detail with reference to necessary drawings.

Figure 2:
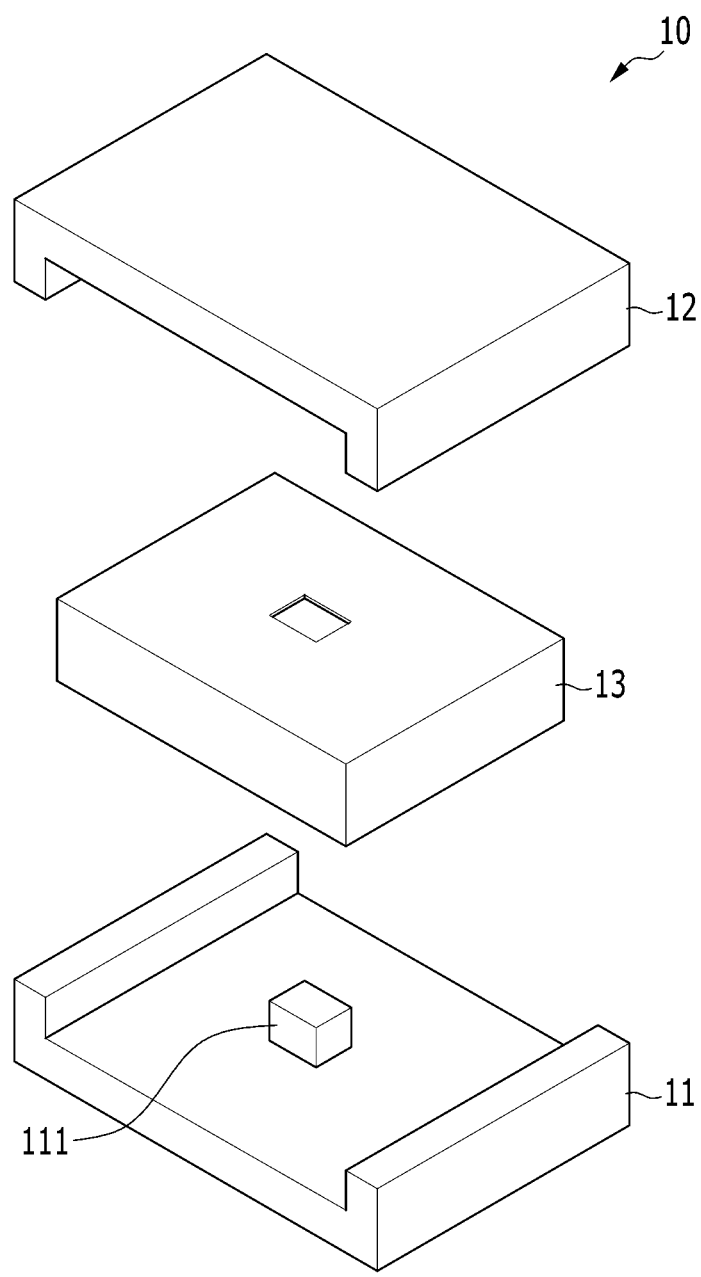

FIGS. 1 and 2 are a perspective view and an exploded perspective view schematically illustrating a planar magnetic element according to embodiments. In addition, FIG. 3 is a view schematically illustrating a cross-sectional view of the planar magnetic element of FIG. 1 taken along line A-A'.

Figure 3:
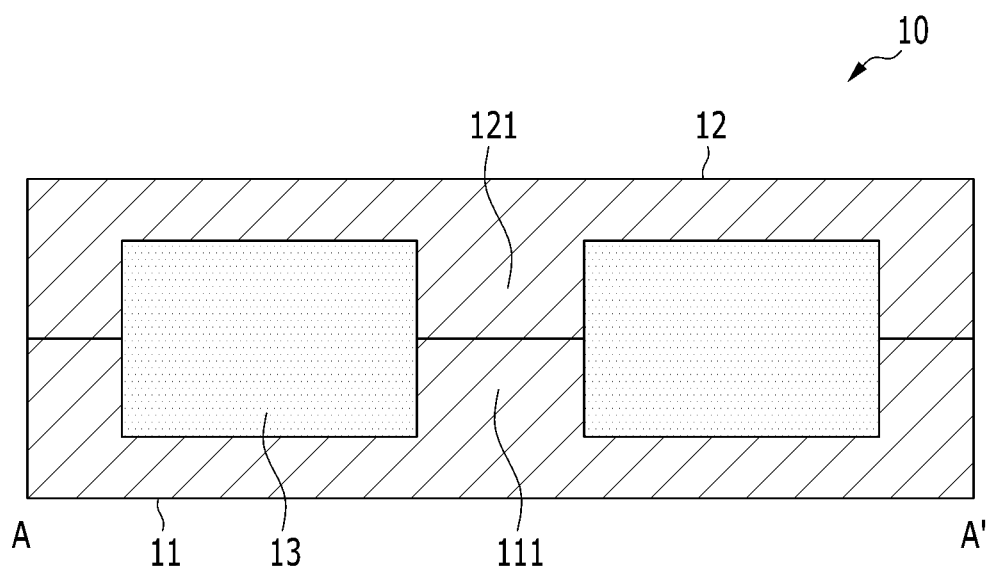
FIG. 3 is a cross-sectional view of the planar magnetic element of FIG. 1 taken along line A-A'.

Referring to FIGS. 1 to 3, a planar magnetic element 10 according to embodiments may include a pair of cores 11 and 12 electromagnetically coupled to each other and a winding unit 13 disposed between the pair of cores 11 and 12.

Each of the cores 11 and 12 is formed with a magnetic substance such as ferrite, carbon steel, silicon steel, or permalloy.

The pair of cores 11 and 12 may each include at least one leg 111 and 121, and the legs may engage with each other to be electromagnetically coupled. The cores 11 and 12 may be provided in various shapes including EE cores, EI cores, UU cores, and UI cores.

The winding unit 13 may include a plurality of winding layers stacked on each other. Each winding layer may include an insulating substrate including a through-hole H into which the legs 111 and 121 of the cores 11 and 12 are inserted and a wound conductive pattern disposed on the insulating substrate. Each winding layer may be configured with a printed circuit board (PCB) in which windings are patterned on the insulating substrate. Hereinafter, the wound conductive pattern is referred to as a "winding".

The planar magnetic element 10 may further include an insulating substrate (not shown) disposed between each of the cores 11 and 12 and the winding unit 13 or between the winding layers of the winding unit 13 in order to improve withstand voltage.

When the planar magnetic element 10 is connected to a switching element at a first terminal (referring to T1 of FIGS. 15 to 17), due to a switching operation of the switching element, a voltage of the first terminal of the planar magnetic element 10 may pulsate. Typically, EMI noise increases as the amplitude of a waveform is larger.

When a constant voltage is supplied to a second terminal (referring to T2 of FIGS. 15 to 17) of the planar magnetic element 10, a magnetic flux swing at the first terminal is extremely large compared to a magnetic flux swing at the second terminal. In embodiments to be described below, the winding layers of the planar magnetic element 10 are disposed such that a winding relatively close to the first terminal among the windings configuring the planar magnetic element 10 is shielded by a winding relatively close to the second terminal. Thus, the EMI noise generated due to large pulsation of the voltage of the first terminal may be decreased by the second terminal supplied with a constant voltage.

In the following description, the first terminal of the planar magnetic element 10 will be set as being connected to the switching element and the second terminal of the planar magnetic element 10 as being connected to a voltage source that supplies a constant voltage.

Figure 15:
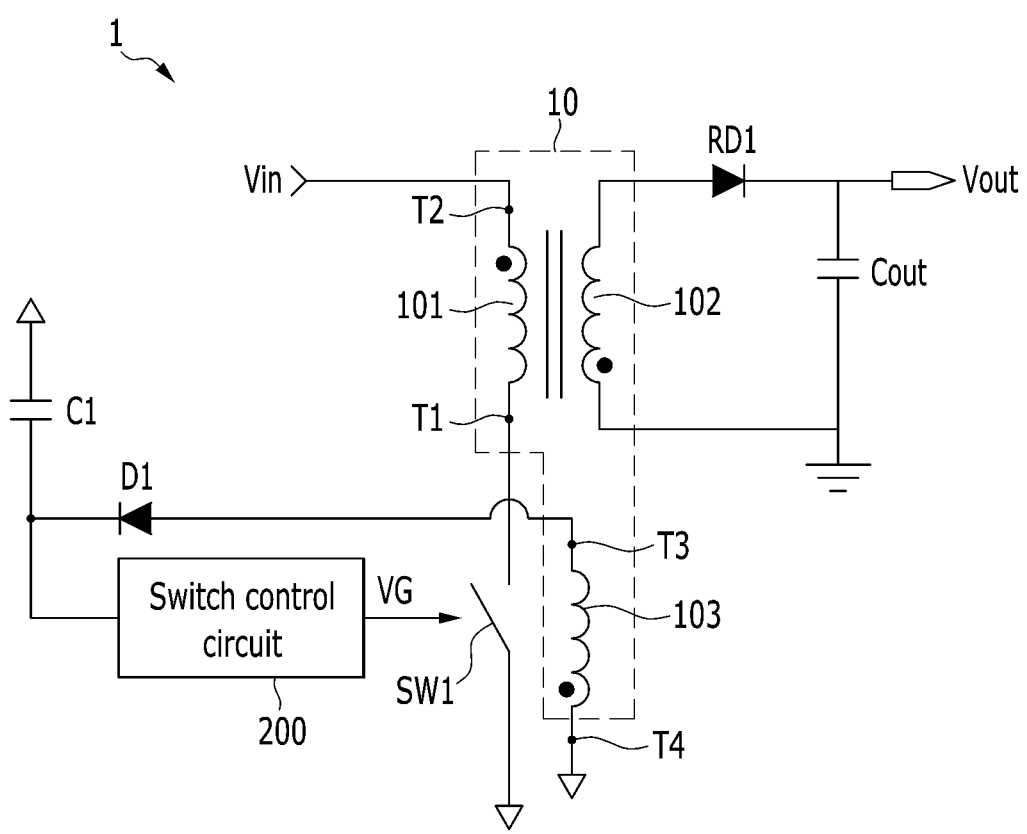
FIGS. 15 to 17 are views illustrating an example of a planar magnetic element applied to an SMPS.
Figure 16:
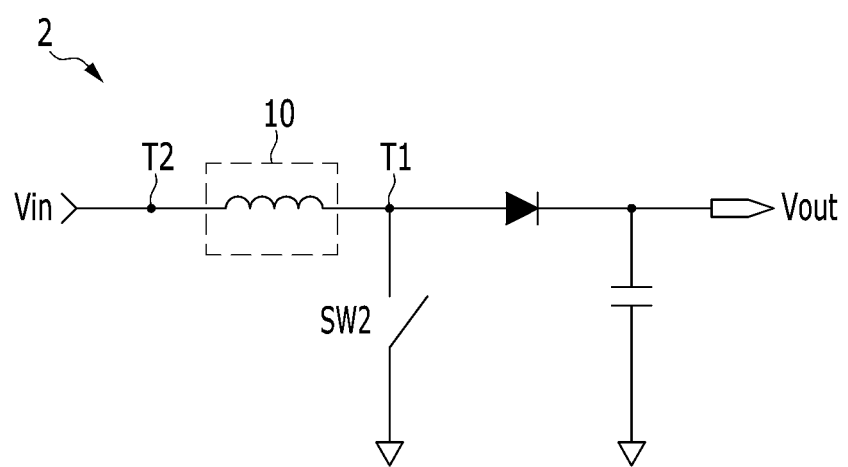
Figure 17:
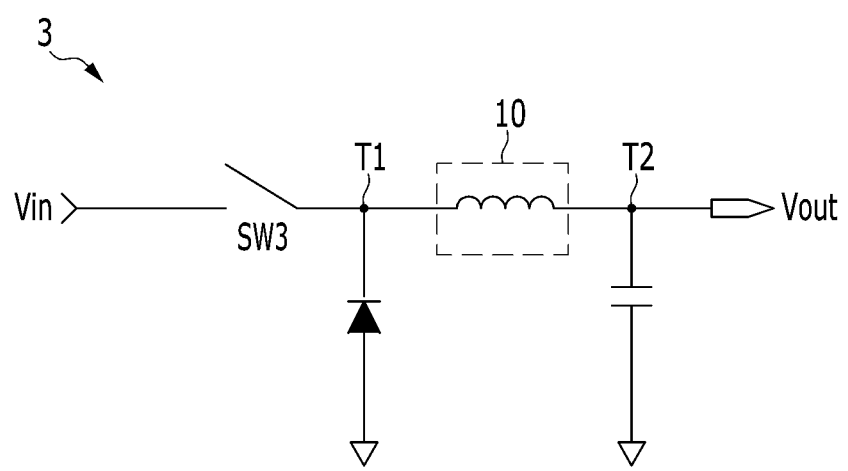

FIGS. 15 to 17 are views illustrating an example of a planar magnetic element applied to an SMPS.

For example, as illustrated in FIG. 15, in a flyback-type SMPS 1 including the planar magnetic element 10, the planar magnetic element 10 may include a first-side winding unit 101, a second-side winding unit 102, and an auxiliary winding unit 103. A first terminal T1 of the first-side winding unit 101 is connected to one end of a switching element SW1, and an input voltage Vin is supplied to a second terminal T2 of the first-side winding unit 101.

A rectification diode RD at the second side rectifies a current flowing in the second-side winding unit 102 of the planar magnetic element 10, and an output voltage Vout is generated by an output capacitor Cout.

One end T3 of the auxiliary winding unit 103 is connected to an anode of a diode D1, other end T4 of the auxiliary winding unit 103 is connected to ground, and a cathode of the diode D1 is connected to one end of a capacitor C1. A current flowing in the auxiliary winding unit 103 is rectified by the diode D1 and supplied to the capacitor C1. A switch control circuit 200 is biased by a voltage at the one end of the capacitor C1. The switch control circuit 200 generates a gate voltage VG that controls a switching operation of the switching element SW1.

Or, as illustrated in FIG. 16, in a boost SMPS 2 including the planar magnetic element 10, the first terminal T1 of the planar magnetic element 10 is connected to one end of a switching element SW2, and the second terminal T2 of the planar magnetic element 10 is connected to the input voltage Vin.

Or, as illustrated in FIG. 17, in a buck-type SMPS 3 including the planar magnetic element 10, the first terminal T1 of the planar magnetic element 10 is connected to one end of a switching element SW3, and the second terminal T2 of the planar magnetic element 10 is connected to the output voltage Vout. Since the buck-type SMPS 3 regulates the output voltage Vout, the output voltage Vout is maintained within a predetermined range despite a ripple component included therein.

As described above, the planar magnetic element 10 may be applied to various types of SMPSs and may include a first terminal connected to a switching element and a second terminal supplied with a constant voltage.

Hereinafter, a planar magnetic element according to embodiments will be described in detail with reference to FIGS. 4 to 14.

In FIGS. 4 to 14, the nodes are shown by the point '•', and the electrical connections between the nodes are shown by the dotted lines. In addition, for the convenience of identification, parts of the dotted lines are indicated by the reference numerals in the format of "alphabet+number". For example, in FIG. 4, the dotted line 'a1' shows an electrical connection between a node connected to the fourth terminal T4a and a node connected to a winding 422a.

Figure 4:
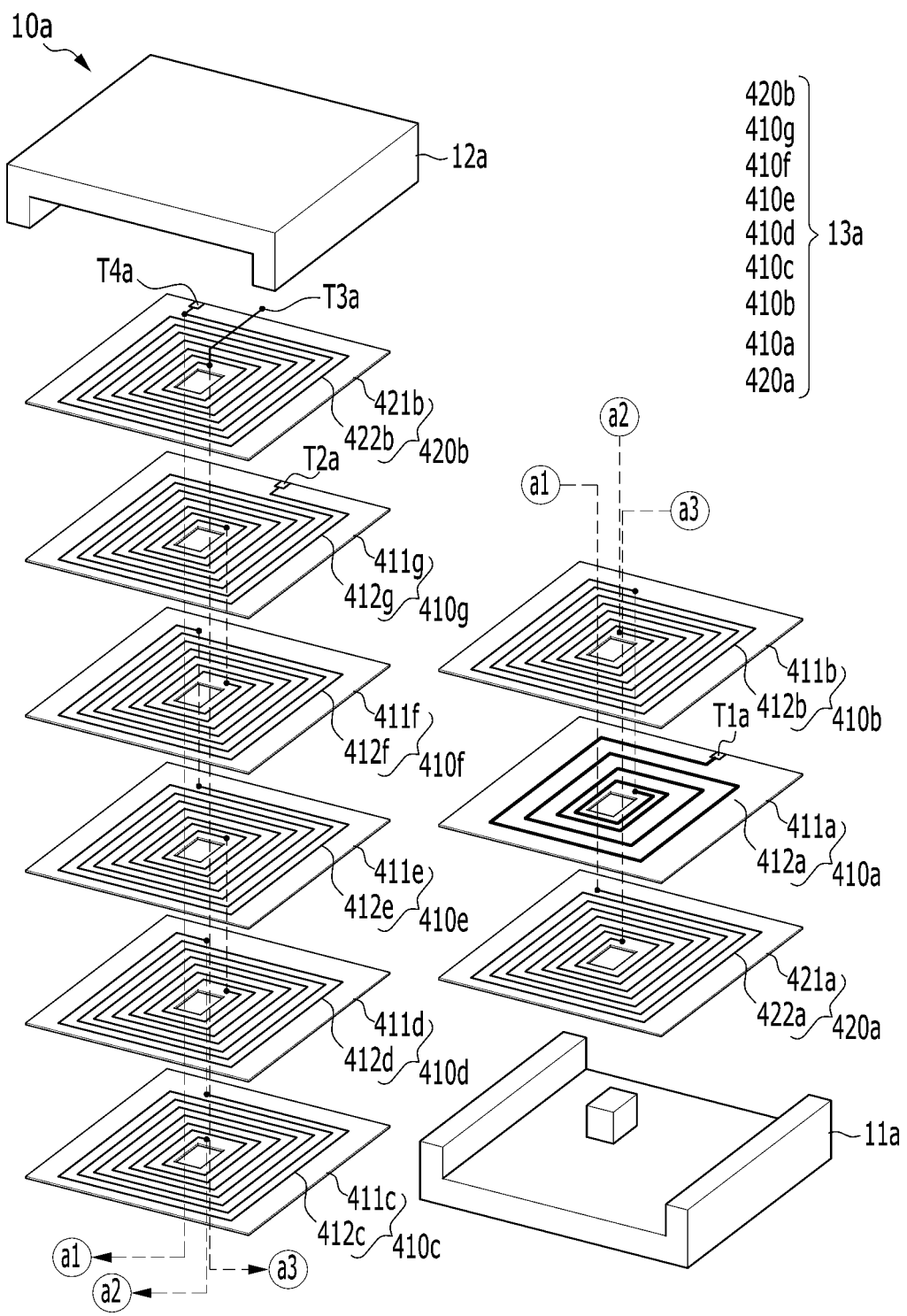
FIG. 4 is a view illustrating a planar magnetic element according to a first embodiment.

FIG. 4 is a view illustrating a planar magnetic element according to a first embodiment.

Referring to FIG. 4, a planar magnetic element 10a according to a first embodiment includes a pair of cores 11a and 12a and a winding unit 13a disposed between the pair of cores 11a and 12a.

The winding unit 13a includes winding layers 410a to 410g stacked between the pair of cores 11a and 12a.

The main winding layers 410a to 410g include substrates 411a to 411g and windings 412a to 412g disposed on the substrates 411a to 411g, respectively. The substrates 411a to 411g of the main winding layers 410a to 410g are formed with an insulating material and include through-holes H into which legs of the cores 11a and 12a are inserted. The windings 412a to 412g of the main winding layers 410a to 410g are formed with metallic materials with high conductivity and are formed with conductive patterns having inductance. For example, the windings 412a to 412g of the main winding layers 410a to 410g may be formed with spiral conductive patterns that rotate about the through-holes H of the substrates 411a to 411g.

The windings 412a to 412g included in the plurality of main winding layers 410a to 410g are connected between a first terminal T1a and a second terminal T2a to form a main winding of the planar magnetic element 10a. The windings 412a to 412g included in the plurality of main winding layers 410a to 410g may be connected to each other in series between the first terminal T1a and the second terminal T2a as illustrated in FIG. 4. However, since the present disclosure is not limited to this, at least some of the windings 412a to 412g included in the plurality of main winding layers 410a to 410g may be connected to each other in parallel. In the present document, when windings disposed at different layers are said to be connected, the windings are electrically connected, and the windings disposed at different layers may be electrically connected to each other through at least one contact hole (not shown).

The end winding 412a directly connected to the first terminal T1a among the windings 412a to 412g that form the main winding may be formed to have different thicknesses, cross-sectional areas, numbers of turns in the windings (winding numbers), etc. from those of the remaining windings 412b to 412g. In the present document, the "end winding" refers to a winding directly connected to the first terminal or the second terminal of the planar magnetic element 10a among the plurality of windings that form one winding. For example, as in FIG. 4, the end winding 412a of the main winding connected to the first terminal T1a may be formed having a smaller winding number compared to the remaining windings 412b to 412g of the main winding. Then, a voltage level generated by the end winding 412a is smaller, and thus the EMI noise may be reduced compared to a conventional case.

In FIG. 4, although a case in which the windings 412a to 412g that form the main winding of the planar magnetic element 10a are sequentially stacked according to a connection order of the windings 412a to 412g is illustrated as an example, the present disclosure is not limited thereto. A stacking sequence of the windings 412a to 412g that form the main winding of the planar magnetic element 10a may be modified regardless of a connection order of the windings 412a to 412g.

The winding unit 13a further includes a plurality of auxiliary winding layers 420a and 420b stacked between the pair of cores 11a and 12a.

The auxiliary winding layers 420a and 420b include substrates 421a and 421b and windings 422a and 422b disposed on the substrates 421a and 421b, respectively. The substrates 421a and 421b of the auxiliary winding layers 420a and 420b are formed with an insulating material and include through-holes H into which the legs of the cores 11a and 12a are inserted. The windings 422a and 422b of the auxiliary winding layers 420a and 420b are formed with metallic materials with high conductivity and are formed with conductive patterns having inductance. For example, the windings 422a and 422b of the auxiliary winding layers 420a and 420b may be formed with spiral conductive patterns that rotate about the through-holes H of the substrates 421a and 421b.

The windings 422a and 422b included in the plurality of auxiliary winding layers 420a and 420b are connected to each other between a third terminal T3a and a fourth terminal T4a to form an auxiliary winding of the planar magnetic element 10a.

In the planar magnetic element 10a, the plurality of auxiliary winding layers 420a and 420b are separately disposed at outsides of the main winding layers 410a to 410g. Accordingly, the main winding layers 410a to 410g are disposed between the auxiliary winding layers 420a and 420b and are shielded by the auxiliary winding layers 420a and 420b.

Meanwhile, in FIG. 4, although a case in which ends of the windings 422a and 422b included in the auxiliary winding layers 420a and 420b are connected to each other and the windings 422a and 422b are connected to each other in parallel between the third terminal T3a and the fourth terminal T4a is illustrated as an example, the present disclosure is not limited thereto. The windings included in the auxiliary winding layers may also be connected to each other in series.

Figure 5:
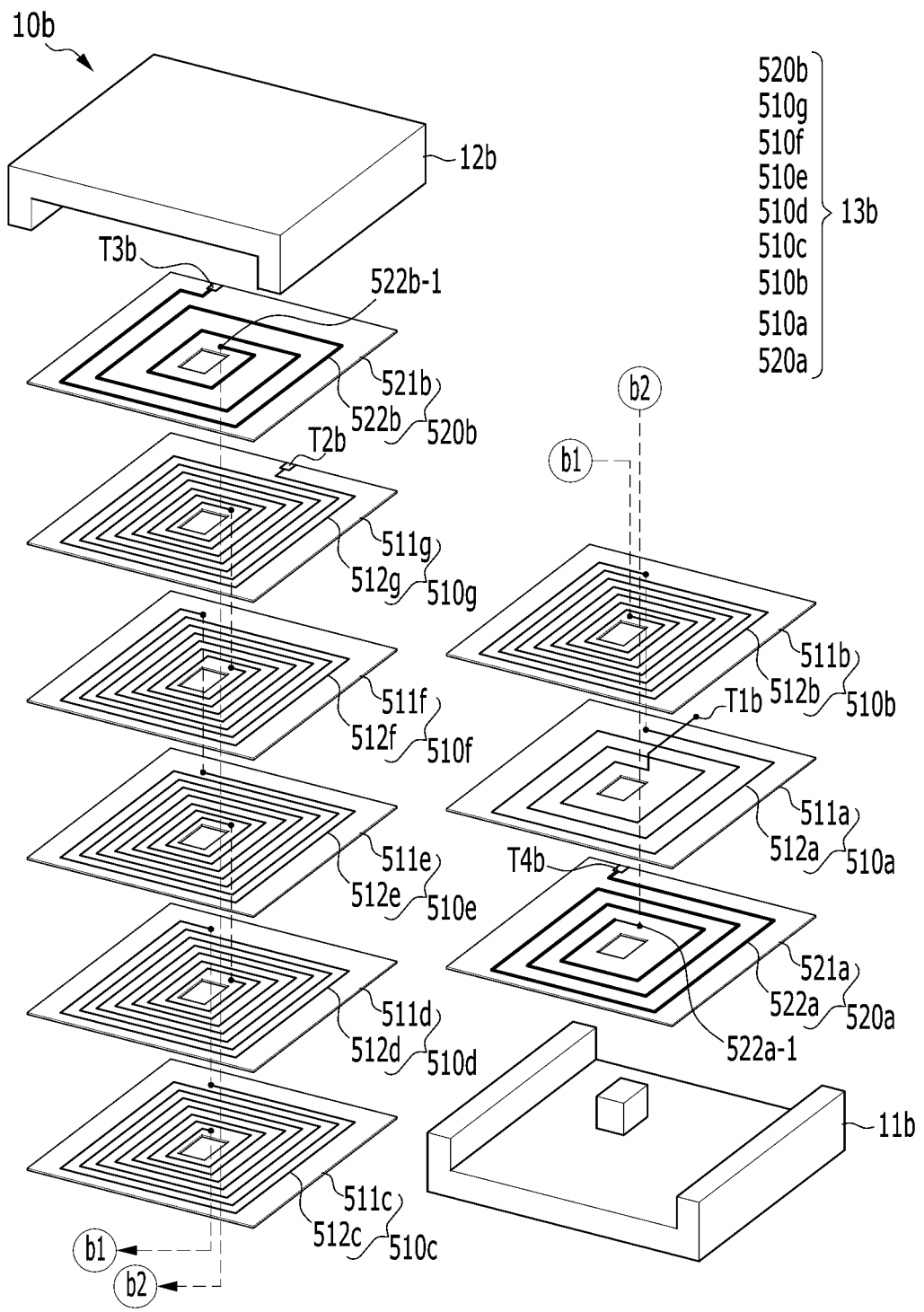
FIG. 5 is a view illustrating a planar magnetic element according to a second embodiment.

FIG. 5 is a view illustrating a planar magnetic element 10b according to a second embodiment and illustrates a case in which windings 522a and 522b of auxiliary winding layers 520a and 520b are connected to each other in series.

Referring to FIG. 5, one end of the winding 522a is connected to a fourth terminal T4b, one end of the winding 522b is connected to a third terminal T3b, and the other end 522a-1 of the winding 522a and the other end 522b-1 of the winding 522b are connected to each other. When the windings 522a and 522b of the auxiliary winding layers 520a and 520b are connected to each other in series as illustrated in FIG. 5, the thicknesses, the cross-sectional areas, the winding numbers, etc. of the windings may be formed differently compared to the case in which the windings 422a and 422b of the auxiliary winding layers 420a and 420b are connected to each other in parallel as illustrated in FIG. 4. When the windings 522a and 522b of the auxiliary winding layers 520a and 520b are connected to each other in series, the thicknesses or the cross-sectional areas of the windings may be larger and the winding numbers may be smaller compared to the case in which the windings 422a and 422b of the auxiliary winding layers 420a and 420b are connected to each other in parallel. A separate winding such as a shield winding, a main winding, etc. may disposed at a remaining portion of the substrates 521a and 521b due to a decrease in the winding numbers of the windings 522a and 522b.

Meanwhile, although the cases in which the planar magnetic elements 10a and 10b include seven main winding layers and two auxiliary winding layers have been illustrated as examples in FIGS. 4 and 5, the present disclosure is not limited thereto. The numbers of main winding layers and auxiliary winding layers that form a planar magnetic element may be modified in various ways according to the capacity of the planar magnetic element. In addition, the thicknesses, the widths, the cross-sectional areas, the winding numbers, etc. of windings included in each winding layer of the planar magnetic element may also be modified in various ways.

According to the first and second embodiments described above, in the planar magnetic elements 10a and 10b, the auxiliary winding layers are disposed at the outsides of the main winding layers, and the main winding layers are disposed between the auxiliary winding layers. Accordingly, the EMI noise at a winding close to a first terminal (e.g. T1a or T1b) to which a switching element is connected may be shielded by auxiliary winding layers having a smaller pulsation of the voltage and the EMI noise may be effectively reduced.

Figure 6:
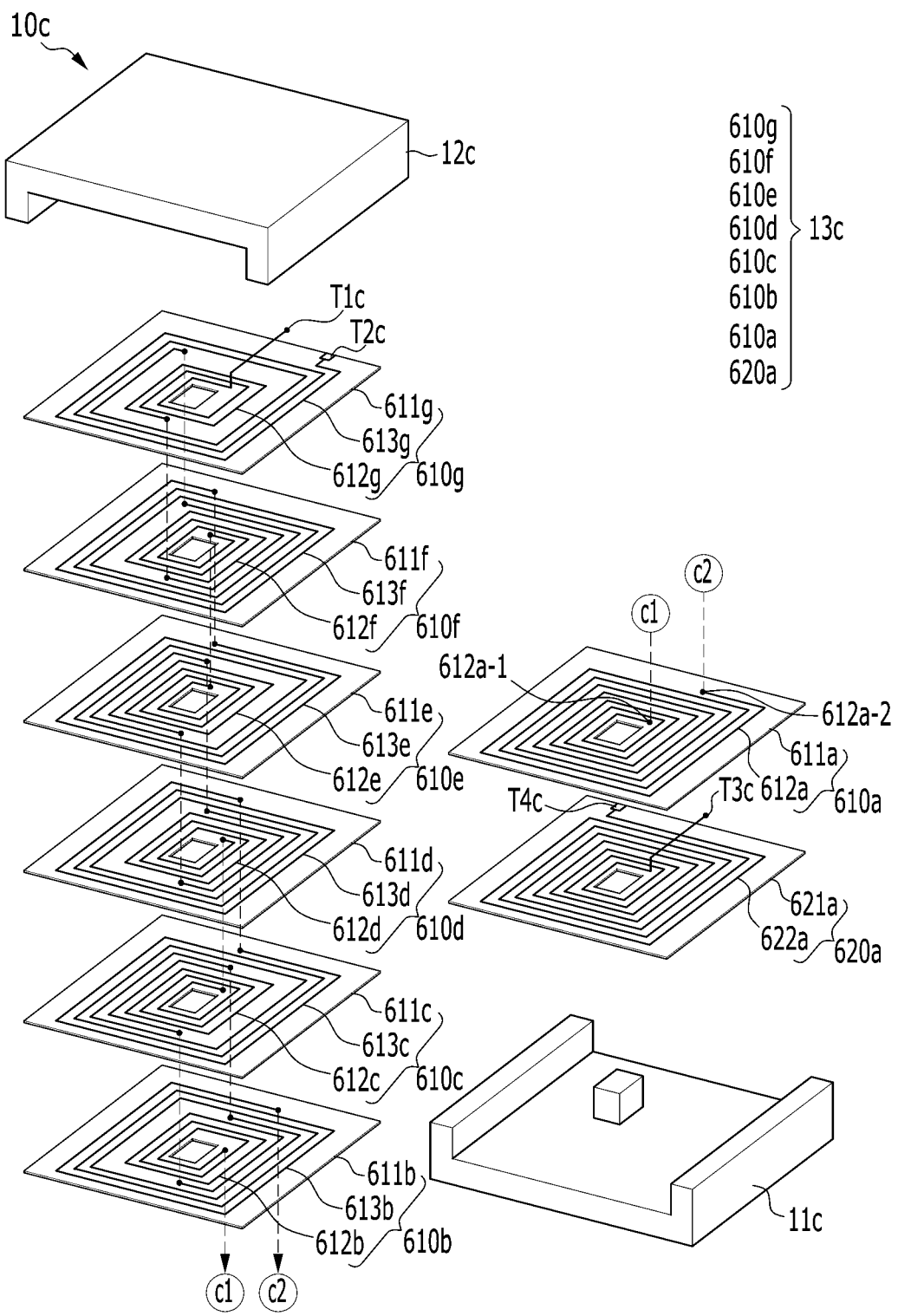
FIG. 6 is a view illustrating a planar magnetic element according to a third embodiment.

FIG. 6 is a view illustrating a planar magnetic element according to a third embodiment.

Referring to FIG. 6, a planar magnetic element 10c according to a third embodiment includes a pair of cores 11c and 12c and a winding unit 13c disposed between the pair of cores 11c and 12c.

The winding unit 13c includes a plurality of main winding layers 610a to 610g stacked between the pair of cores 11c and 12c.

The main winding layers 610a to 610g include substrates 611a to 611g and windings 612a to 612g and 613b to 613g disposed on the substrates 611a to 611g, respectively.

The windings 612a to 612g and 613b to 613g included in the plurality of main winding layers 610a to 610g are connected between a first terminal T1c and a second terminal T2c to form a main winding of the planar magnetic element 10c.

Some of the main winding layers 610b to 610g among the plurality of main winding layers 610a to 610g include windings 612b to 612g (hereinafter referred to as "inner windings") disposed at inner portions of the substrates 611b to 611g and windings 613b to 613g (hereinafter referred to as "outer windings") disposed at outer portions of the inner windings 612b to 612g on the substrates 611b to 611g. In addition, the winding 612a (hereinafter referred to as a "connecting winding") that connects one another the inner windings 612b to 612g to the outer windings 613b to 613g is disposed on the remaining main winding layer 610a.

The inner windings 612b to 612g are connected between the first terminal T1c and one end 612a-1 of the connecting winding 612a. The outer windings 613b to 613g are connected between the second terminal T2c and the other end 612a-2 of the connecting windings 612a. Accordingly, among the windings 612a to 612g and 613b to 613g that form the main winding of the planar magnetic element 10c, the windings 613b to 613g relatively closely connected to the second terminal T2c are disposed at the outer portions of the windings 612a to 612g closely connected to the first terminal T1c.

The windings 612a to 612g and 613b to 613g that form the main winding of the planar magnetic element 10c may be connected to each other in series between the first terminal T1c and the second terminal T2c as illustrated in FIG. 6. However, since the present disclosure is not limited thereto, at least some of the windings 612a to 612g and 613b to 613g included in the main winding may be connected to each other in parallel.

The winding unit 13c may further include an auxiliary winding layer 620a disposed between the pair of cores 11c and 12c.

The auxiliary winding layer 620a includes a substrate 621a and a winding 622a disposed on the substrate 621a. The winding 622a of the auxiliary winding layer 620a is connected between a third terminal T3c and a fourth terminal T4c to form an auxiliary winding of the planar magnetic element 10c. In FIG. 6, although the auxiliary winding layer 620a is illustrated as being disposed between the main winding layers 610a to 610g and the core 11c, the auxiliary winding layer 620a may be disposed between the main winding layers 610a to 610g and the core 12c.

Although a case in which the planar magnetic element 10c includes seven main winding layers and one auxiliary winding layer is illustrated as an example in FIG. 6, the present disclosure is not limited thereto, and the numbers of main winding layers and auxiliary winding layers that form the planar magnetic element may be modified in various ways. For example, the planar magnetic element 10c may further include more than one auxiliary winding layer. In this case, as in the planar magnetic elements 10a and 10b according to the first and second embodiments, the auxiliary winding layers of the planar magnetic element 10c may be separately disposed at outsides of the main winding layers. Meanwhile, an auxiliary winding layer is not essential to the planar magnetic element 10c according to the third embodiment and thus may also be omitted.

The thicknesses, the widths, the cross-sectional areas, the winding numbers, etc. of the windings included in each winding layer that form the planar magnetic element 10c may also be modified in various ways.

According to the third embodiment described above, among the windings that form the main winding in each winding layer of the planar magnetic element 10c, the windings relatively close to the second terminal T2c are disposed at outside of the windings relatively close to the first terminal T1c. Consequently, even when a switching element is connected to the first terminal T1c, the EMI noise at a winding relatively closely connected to the first terminal T1c is shielded by a winding relatively closely connected to the second terminal T2c in the main winding, and thus the EMI noise of the planar magnetic element 10c may be effectively reduced.

Figure 7:
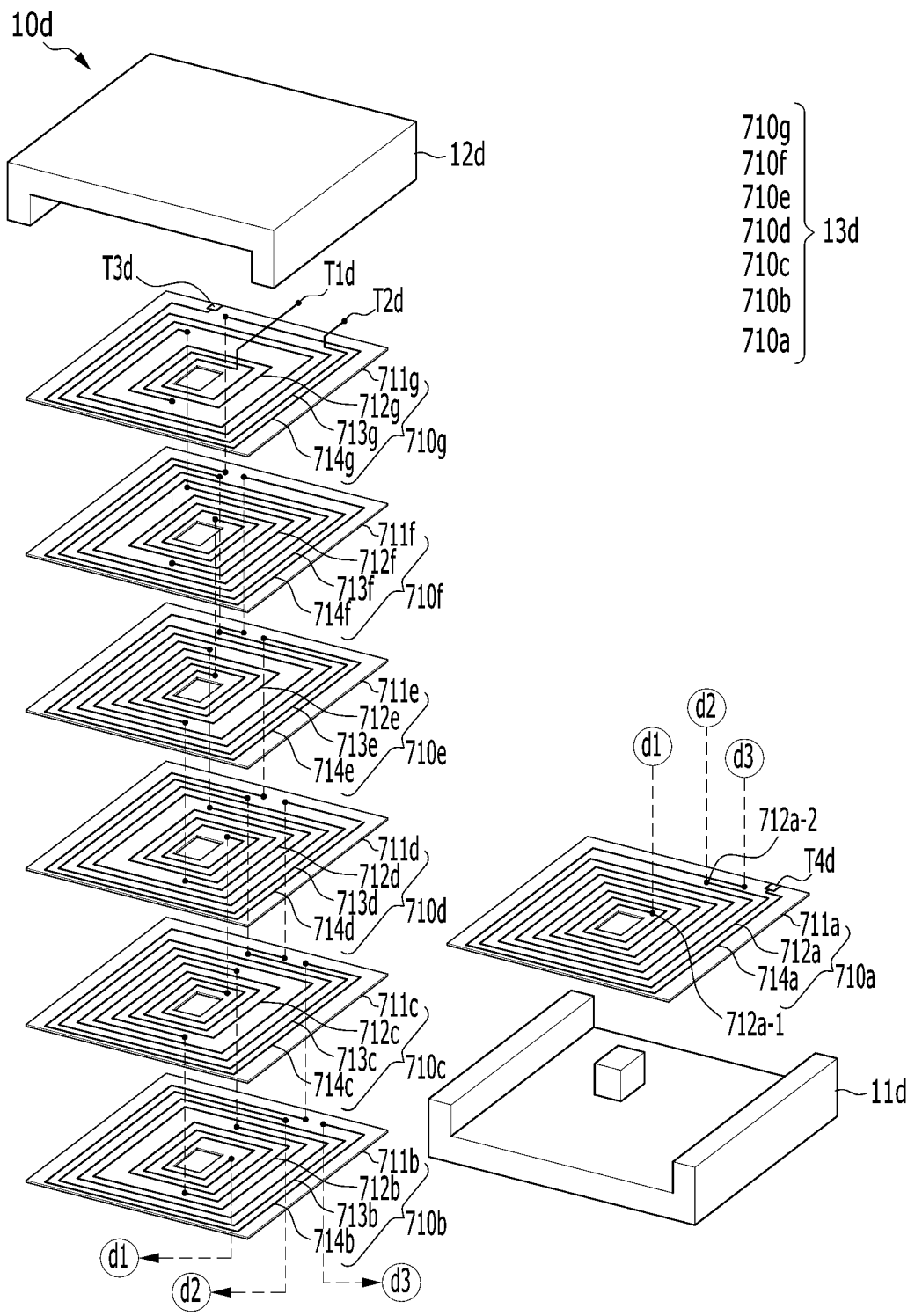
FIG. 7 is a view illustrating a planar magnetic element according to a fourth embodiment.

FIG. 7 is a view illustrating a planar magnetic element according to a fourth embodiment.

Referring to FIG. 7, a planar magnetic element 10d according to a fourth embodiment includes a pair of cores 11d and 12d and a winding unit 13d disposed between the pair of cores 11d and 12d.

The winding unit 13d includes a plurality of winding layers 710a to 710g stacked between the pair of cores 11d and 12d.

The winding layers 710a to 710g include substrates 711a to 711g and a plurality of windings 712a to 712g, 713b to 713g, and 714a to 714g disposed on the substrates 711a to 711g, respectively.

The windings disposed at the plurality of winding layers 710a to 710g include the windings 712a to 712g and 713b to 713g connected between a first terminal T1d and a second terminal T2d to form a main winding of the planar magnetic element 10d.

The windings that form the main winding of the planar magnetic element 10d include a plurality of windings 712b to 712g (hereinafter referred to as "inner windings") disposed at inner portions on the substrates 711b to 711g respectively, windings 713b to 713g (hereinafter referred to as "outer windings") disposed at outer portions of the inner windings 712b to 712g on the substrates 711b to 711g, and the winding 712a (hereinafter referred to as a "connecting winding") that connects the inner windings 712b to 712g to the outer windings 713b to 713g.

The inner windings 712b to 712g are connected between the first terminal T1d and one end 712a-1 of the connecting winding 712a. The outer windings 713b to 713g are connected to each other between the second terminal T2d and the other end 712a-2 of the connecting winding 712a. Accordingly, among the windings that form the main winding of the planar magnetic element 10d, the windings 713b to 713g relatively close to the second terminal T2d are disposed at outer portions of the windings 712b to 712g relatively close to the first terminal T1d.

Although the windings 712a to 712g and 713b to 713g that form the main winding of the planar magnetic element 10d may be connected to each other in series between the first terminal T1d and the second terminal T2d as illustrated in FIG. 7, since the present disclosure is not limited thereto, at least some of the windings that form the main winding may also be connected to each other in parallel.

The windings disposed on the plurality of winding layers 710a to 710g further include the windings 714a to 714g connected between a third terminal T3d and a fourth terminal T4d to form an auxiliary winding of the planar magnetic element 10d.

The windings that form the auxiliary winding of the planar magnetic element 10d are disposed at outer portions of the windings 712a to 712g and 713b to 713g that form the main winding of the planar magnetic element 10d on the substrates 711a to 711g respectively.

Although the windings 714a to 714g that form the auxiliary winding of the planar magnetic element 10d may be connected to each other in series between the third terminal T3d and the fourth terminal T4d as illustrated in FIG. 7, since the present disclosure is not limited thereto, at least some of the windings that form the main winding may also be connected to each other in parallel.

According to the fourth embodiment described above, in the winding layers of the planar magnetic element 10d, the windings that form the auxiliary winding are disposed at outer portions of the windings that form the main winding. Consequently, even when a switching element is connected to the first terminal T1d, the EMI noise generated at the main winding is shielded by the auxiliary winding together with the shielding effect provided from the third embodiment, and thus the EMI noise of the planar magnetic element 10d may be effectively reduced.

Figure 8:
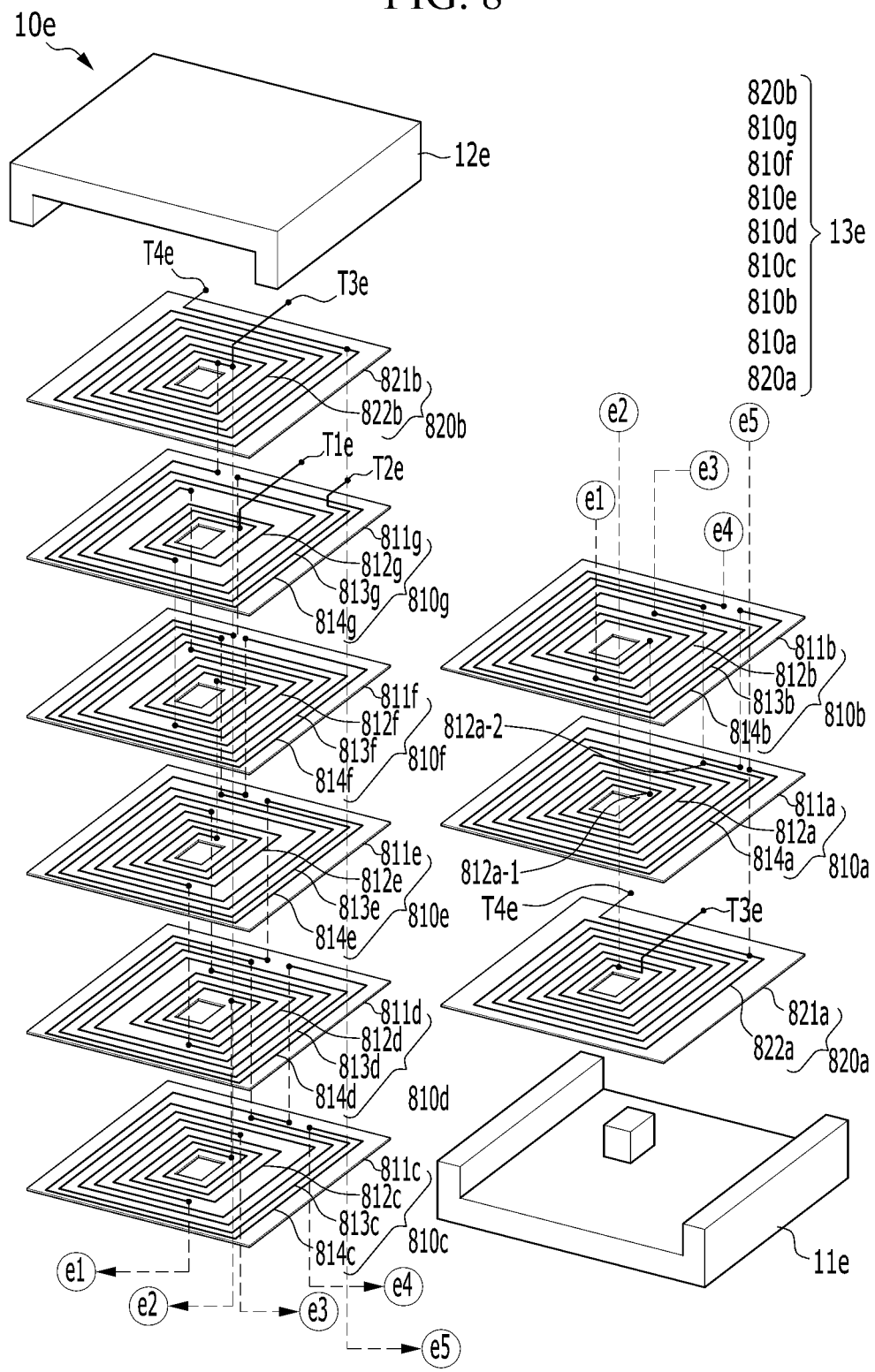
FIG. 8 is a view illustrating a planar magnetic element according to a fifth embodiment.

FIG. 8 is a view illustrating a planar magnetic element according to a fifth embodiment.

Referring to FIG. 8, a planar magnetic element 10e according to a fifth embodiment includes a pair of cores 11e and 12e and a winding unit 13e disposed between the pair of cores 11e and 12e.

The winding unit 13e includes a plurality of main winding layers 810a to 810g stacked between the pair of cores 11e and 12e.

The main winding layers 810a to 810g include substrates 811a to 811g and a plurality of windings 812a to 812g, 813b to 813g, and 814a to 814g disposed on the substrates 811a to 811g, respectively.

The main winding layers 810a to 810g include the plurality of windings 812a to 812g and 813b to 813g connected between a first terminal T1e and a second terminal T2e to form a main winding of the planar magnetic element 10e.

The windings 812a to 812g and 813b to 813g that form the main winding of the planar magnetic element 10e include the windings 812b to 812g (hereinafter referred to as "inner windings") disposed at inner portions of the substrates 811b to 811g respectively, the windings 813b to 813g (hereinafter referred to as "outer windings") disposed at outer portions of the inner windings 812b to 812g on the substrates 811b to 811g respectively, and the winding 812a (hereinafter referred to as a "connecting winding") that interconnects the inner windings 812b to 812g to the outer windings 813b to 813g.

The inner windings 812b to 812g are connected to each other in series between the first terminal T1e and one end 812a-1 of the connecting winding 812a. The outer windings 813b to 813g are connected between the second terminal T2e and the other end 812a-2 of the connecting winding 812a. Accordingly, among the windings 812a to 812g and 813b to 813g that form the main winding of the planar magnetic element 10e, the windings 813b to 813g relatively close to the second terminal T2e are disposed at outer portions of the windings 812b to 812g relatively close to the first terminal T1e.

Although the windings 812a to 812g and 813b to 813g that form the main winding of the planar magnetic element 10e may be connected to each other in series between the first terminal T1e and the second terminal T2e as illustrated in FIG. 8, since the present disclosure is not limited thereto, at least some of the windings 812a to 812g and 813b to 813g that form the main winding may be connected to in parallel.

The main winding layers 810a to 810g may further include the windings 814a to 814g connected between a third terminal T3e and a fourth terminal T4e to form an auxiliary winding of the planar magnetic element 10e.

The windings 814a to 814g of the auxiliary winding disposed at the main winding layers 810a to 810g are disposed at outer portions of the windings 812a to 812g and 813b to 813g that form the main winding of the planar magnetic element 10e on the substrates 811a to 811g respectively. The windings 814a to 814g of the auxiliary winding disposed at the main winding layers 810a to 810g may be connected to each other in series between the third terminal T3e and the fourth terminal T4e.

The winding unit 13e may further include a plurality of auxiliary winding layers 820a and 820b.

The auxiliary winding layers 820a and 820b include substrates 821a and 821b and windings 822a and 822b disposed on the substrates 821a and 821b, respectively. The windings 822a and 822b disposed on the auxiliary winding layers 820a and 820b are connected between the third terminal T3e and the fourth terminal T4e together with the windings 814a to 814g of the auxiliary winding disposed on the main winding layers 810a to 810g to form the auxiliary winding of the planar magnetic element 10e.

In the planar magnetic element 10e, the plurality of auxiliary winding layers 820a and 820b may be separately disposed at an upper portion and a lower portion having the main winding layers 810a and 810g therebetween. In this case, the main winding layers 810a to 810g are disposed between the auxiliary winding layers 820a and 820b. In addition, the windings 822a and 822b disposed on the auxiliary winding layers 820a and 820b may be connected to each other in in parallel, and the windings 822a and 822b disposed on the auxiliary winding layers 820a and 820b may be connected to the windings 814a to 814g of the auxiliary winding disposed at the main winding layers 810a to 810g in parallel.

The windings 814a to 814g of the auxiliary winding disposed at the main winding layers 810a to 810g may be connected to each other in series between the third terminal T3e and the fourth terminal T4e.

Although a case in which the planar magnetic element 10e includes seven main winding layers and two auxiliary winding layers is illustrated as an example in FIG. 8, the present disclosure is not limited thereto, and the numbers of main winding layers and auxiliary winding layers that form the planar magnetic element 10e may be modified in various ways. In addition, the thicknesses, the widths, the cross-sectional areas, the numbers of turns, etc. of windings included in the winding layers that form the planar magnetic element 10e may also be modified in various ways.

According to the fifth embodiment described above, in the winding layers of the planar magnetic element 10e, windings that form the auxiliary winding are disposed at outer portions of the windings that form the main winding. In addition, the main winding layers are disposed between the auxiliary winding layers, and thus the main winding is shielded by the auxiliary winding layers. Consequently, even when a switching element is connected to the first terminal T1e, the EMI noise generated at the main winding is shielded by the auxiliary winding together with the shielding effect provided from the third embodiment, and thus the EMI noise of the planar magnetic element 10e may be effectively reduced.

Figure 9:
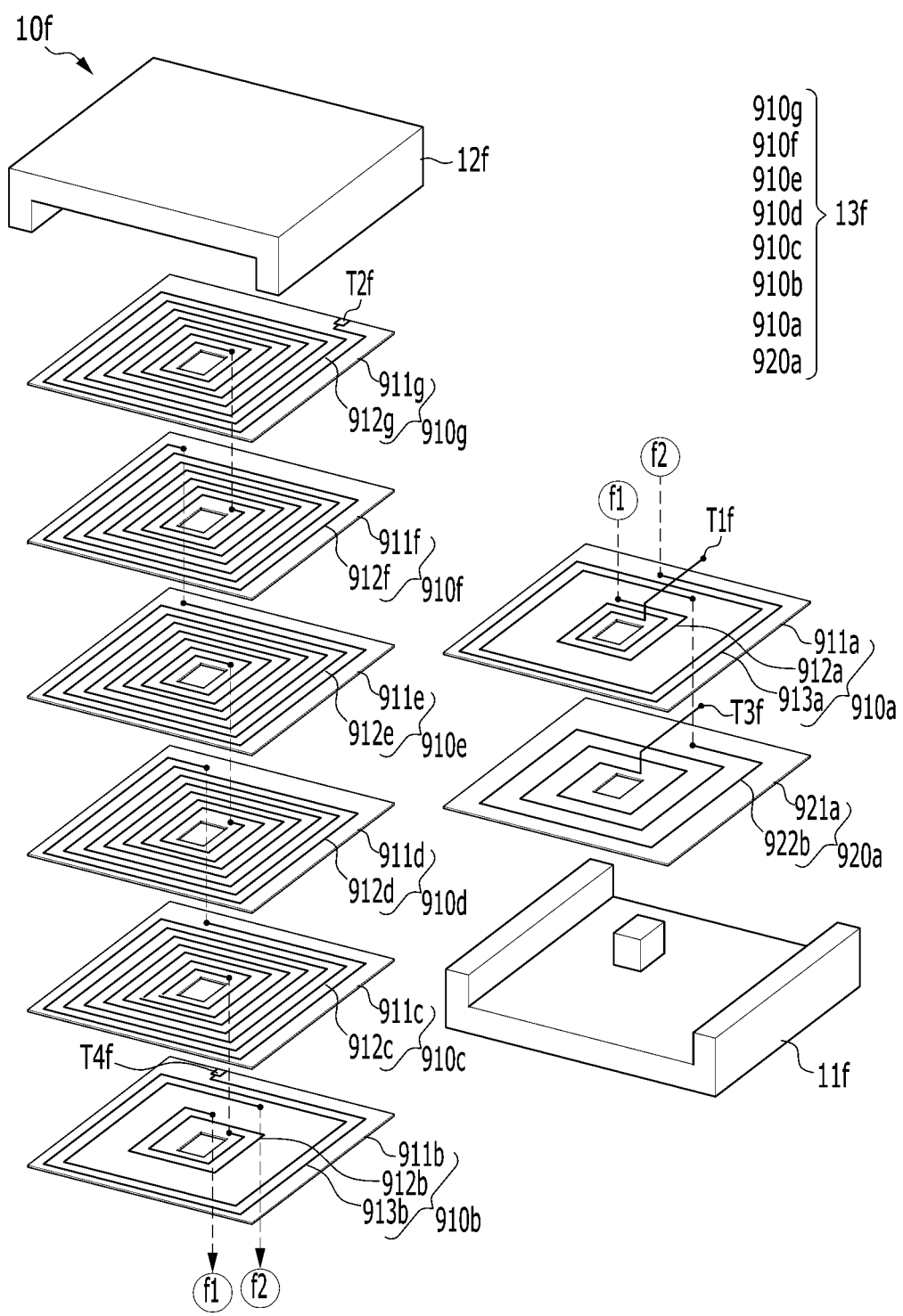
FIG. 9 is a view illustrating a planar magnetic element according to a sixth embodiment.

FIG. 9 is a view illustrating a planar magnetic element according to a sixth embodiment.

Referring to FIG. 9, a planar magnetic element 10f according to a sixth embodiment includes a pair of cores 11f and 12f and a winding unit 13f disposed between the pair of cores 11f and 12f.

The winding unit 13f includes a plurality of main winding layers 910a to 910g stacked between the pair of cores 11f and 12f.

The main winding layers 910a to 910g include substrates 911a to 911g and a plurality of windings 912a to 912g, 913a, and 913b disposed on the substrates 911a to 911g, respectively.

The plurality of main winding layers 910a to 910g include the plurality of windings 912a to 912g connected between a first terminal T1f and a second terminal T2f to form a main winding of the planar magnetic element 10f. Although the windings 912a to 912g that form the main winding of the planar magnetic element 10f may be connected to each other in series between the first terminal T1f and the second terminal T2f as illustrated in FIG. 9, since the present disclosure is not limited thereto, at least some of the windings 912a to 912g that form the main winding may be connected in parallel.

Some main winding layers 910a and 910b of the plurality of main winding layers 910a to 910g may further include the windings 913a and 913b of an auxiliary winding connected between a third terminal T3f and a fourth terminal T4f. For example, as in FIG. 9, the windings 913a and 913b of the auxiliary winding may be disposed at the main winding layers 910a and 910b including the two windings 912a and 912b closely connected to the first terminal T1f among the windings 912a to 912g that form the main winding. In this case, the number of turns in the windings of the main winding disposed at the same layers as the windings 913a and 913b of the auxiliary winding, i.e., the two windings 912a and 912b closely connected to the first terminal T1f, may have smaller numbers of turns in the windings compared to other windings 912c to 912g that form the main winding.

The windings 913a and 913b of the auxiliary winding disposed at the main winding layers 910a and 910b may be disposed at outer portions of the windings 912a and 912b that form the main winding on the substrates 911a and 911b.

The winding unit 13f may further include an auxiliary winding layer 920a disposed between the pair of cores 11f and 12f.

The auxiliary winding layer 920a includes a substrate 921a and a winding 922a disposed on the substrate 921a. The winding 922a of the auxiliary winding layer 920a is connected between the third terminal T3f and the fourth terminal T4f together with the windings 913a and 913b of the auxiliary winding disposed at the main winding layers 910a and 910b to form the auxiliary winding of the planar magnetic element 10f.

In the planar magnetic element 10f, the auxiliary winding layer 920a may be disposed at an upper portion or a lower portion of the main winding layers 910a to 910g. For example, as in FIG. 9, the auxiliary winding layer 920a may be disposed at a lower portion of the main winding layer 910a at which an end winding 912a connected to the first terminal T1f is disposed among the main winding layers 910a to 910g.

Although a case in which the planar magnetic element 10f includes seven main winding layers and one auxiliary winding layer is illustrated as an example in FIG. 9, the present disclosure is not limited thereto, and the numbers of main winding layers and auxiliary winding layers that form the planar magnetic element 10f may be modified in various ways. For example, the auxiliary winding layer 920a may be omitted.

The thicknesses, the widths, the cross-sectional areas, the numbers of turns, etc. of the windings included in the winding layers that form the planar magnetic element 10f may also be modified in various ways.

According to the sixth embodiment described above, some of the windings of the auxiliary winding are disposed at outer boundaries of the substrates at a winding layer including windings closely connected to the first terminal T1f among the windings that form the main winding of the planar magnetic element 10f. Consequently, even when a switching element is connected to the first terminal T1f, a portion of the main winding at which large EMI noise is generated is shielded by the auxiliary wiring, and thus the EMI noise of the planar magnetic element 10f may be effectively reduced.

Figure 10:
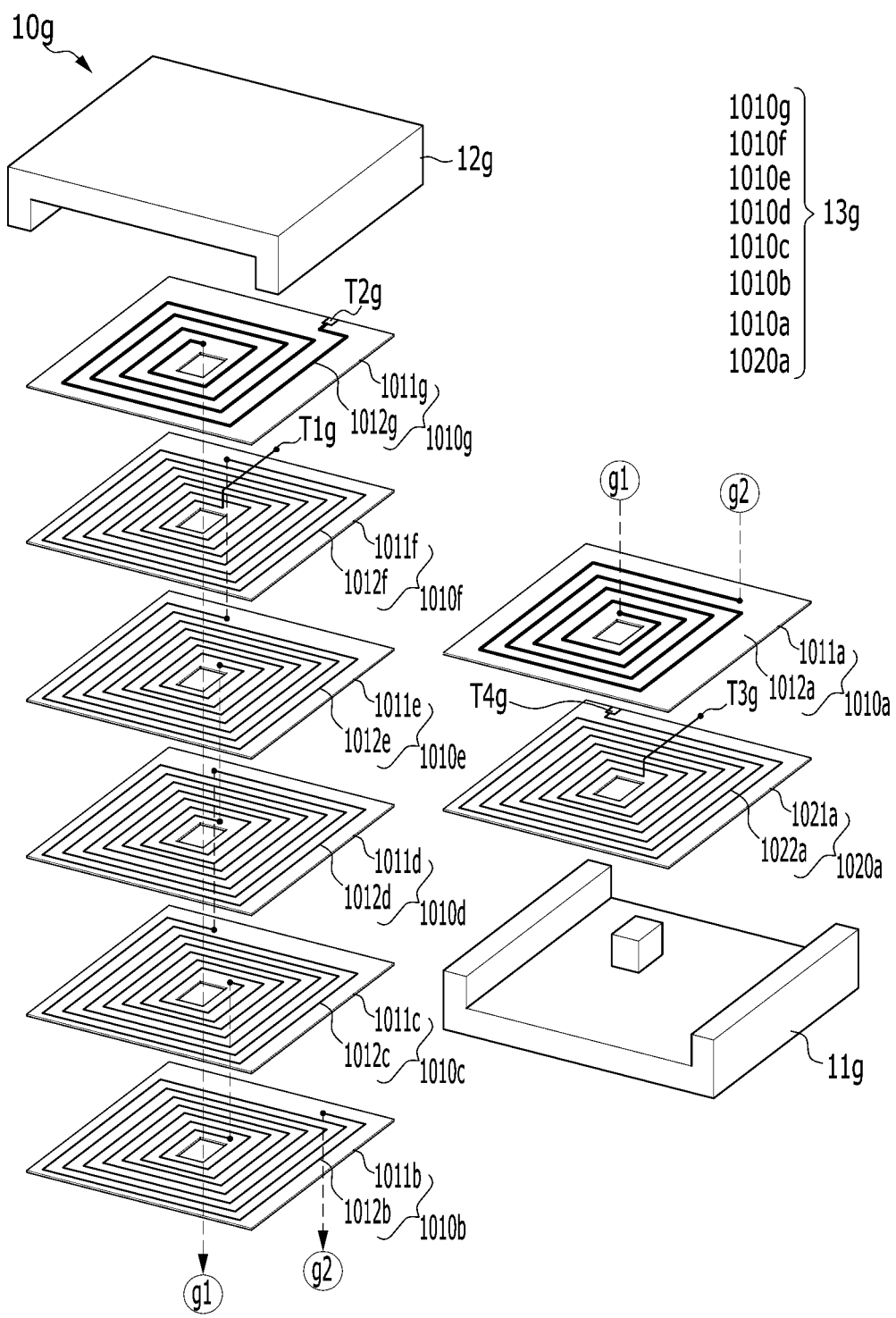
FIG. 10 is a view illustrating a planar magnetic element according to a seventh embodiment.

FIG. 10 is a view illustrating a planar magnetic element according to a seventh embodiment.

Referring to FIG. 10, a planar magnetic element 10g according to a seventh embodiment includes a pair of cores 11g and 12g and a winding unit 13g disposed between the pair of cores 11g and 12g.

The winding unit 13g includes a plurality of main winding layers 1010a to 1010g disposed between the pair of cores 11g and 12g.

The main winding layers 1010a to 1010g include substrates 1011a to 1011g and windings 1012a to 1012g disposed on the substrates 1011a to 1011g, respectively. The windings 1012a to 1012g included in the plurality of main winding layers 1010a to 1010g are connected between a first terminal T1g and a second terminal T2g to form a main winding of the planar magnetic element 10g.

Among the plurality of main winding layers 1010a to 1010g, the main winding layer 1010f at which an end winding 1012f connected to the first terminal T1g is disposed may be disposed between the remaining main winding layers 1010a to 1010e and 1010g. For example, as in FIG. 10, the main winding layer 1010f including the end winding 1012f connected to the first terminal T1g is disposed between the main winding layer 1010g including an end winding 1012g connected to the second terminal T2g and the remaining main winding layers 1010a to 1010e.

In FIG. 10, although the main winding layer 1010f is illustrated as being disposed between the main winding layer 1010g and the remaining main winding layers 1010a to 1010e, the main winding layer 1010f may be disposed between the main winding layers 1010a to 1010e.

In FIG. 10, although the main winding layers 1010a to 1010e that are close to the first terminal T1g are disposed close to the main winding layer 1010f, the present disclosure is not limited thereto. The main winding layers 1010a to 1010e may be disposed at positions different from those illustrated in FIG. 10 by being connected in parallel.

The main winding layers 1010a and 1010g disposed at outermost portions among the plurality of main winding layers 1010a to 1010g may have thicknesses, cross-sectional areas, numbers of turns in the windings, etc. different from those of the remaining main winding layers 1010b to 1010f. For example, as in FIG. 10, the main winding layers 1010a and 1010g disposed at the outermost portions among the plurality of main winding layers 1010a to 1010g may be formed to have smaller numbers of turns in the windings and larger winding widths than the remaining main winding layers 1010b to 1010f.

As the number of turns in the winding is smaller or the winding width is larger, a change in magnetic flux due to voltage pulsation becomes smaller. In FIG. 10, the windings of the main winding layers 1010a and 1010g may improve an effect of shielding the EMI noise of the main winding layer 1010f.

The winding unit 13g may further include an auxiliary winding layer 1020a disposed between the pair of cores 11g and 12g.

The auxiliary winding layer 1020a includes a substrate 1021a and a winding 1022a disposed on the substrate 1021a. The winding 1022a of the auxiliary winding layer 1020a is connected between a third terminal T3g and a fourth terminal T4g to form an auxiliary winding of the planar magnetic element 10g.

In the planar magnetic element 10g, the auxiliary winding layer 1020a may be disposed at an upper portion or a lower portion of the main winding layers 1010a to 1010g. For example, as in FIG. 10, the auxiliary winding layer 1020a is disposed at the lower portion of the main winding layers 1010a to 1010g.

Although a case in which the planar magnetic element 10g includes seven main winding layers and one auxiliary winding layer is illustrated as an example in FIG. 10, the present disclosure is not limited thereto, and the numbers of main winding layers and auxiliary winding layers that form the planar magnetic element may be modified in various ways. For example, the auxiliary winding layer may also be omitted from the planar magnetic element 10g.

The thicknesses, the widths, the cross-sectional areas, the numbers of turns, etc. of the windings included in the winding layers that form the planar magnetic element 10g may also be modified in various ways.

According to the seventh embodiment described above, among the windings that form the main winding in the planar magnetic element 10g, windings relatively close to the second terminal T2g are disposed at outer portions of windings relatively close to the first terminal T1g. Consequently, even when a switching element is connected to the first terminal T1g, the EMI noise of a winding relatively closely connected to the first terminal T1g is shielded by a winding relatively closely connected to the second terminal T2g in the main winding, and thus the EMI noise of the planar magnetic element 10g may be effectively reduced.

Figure 11:
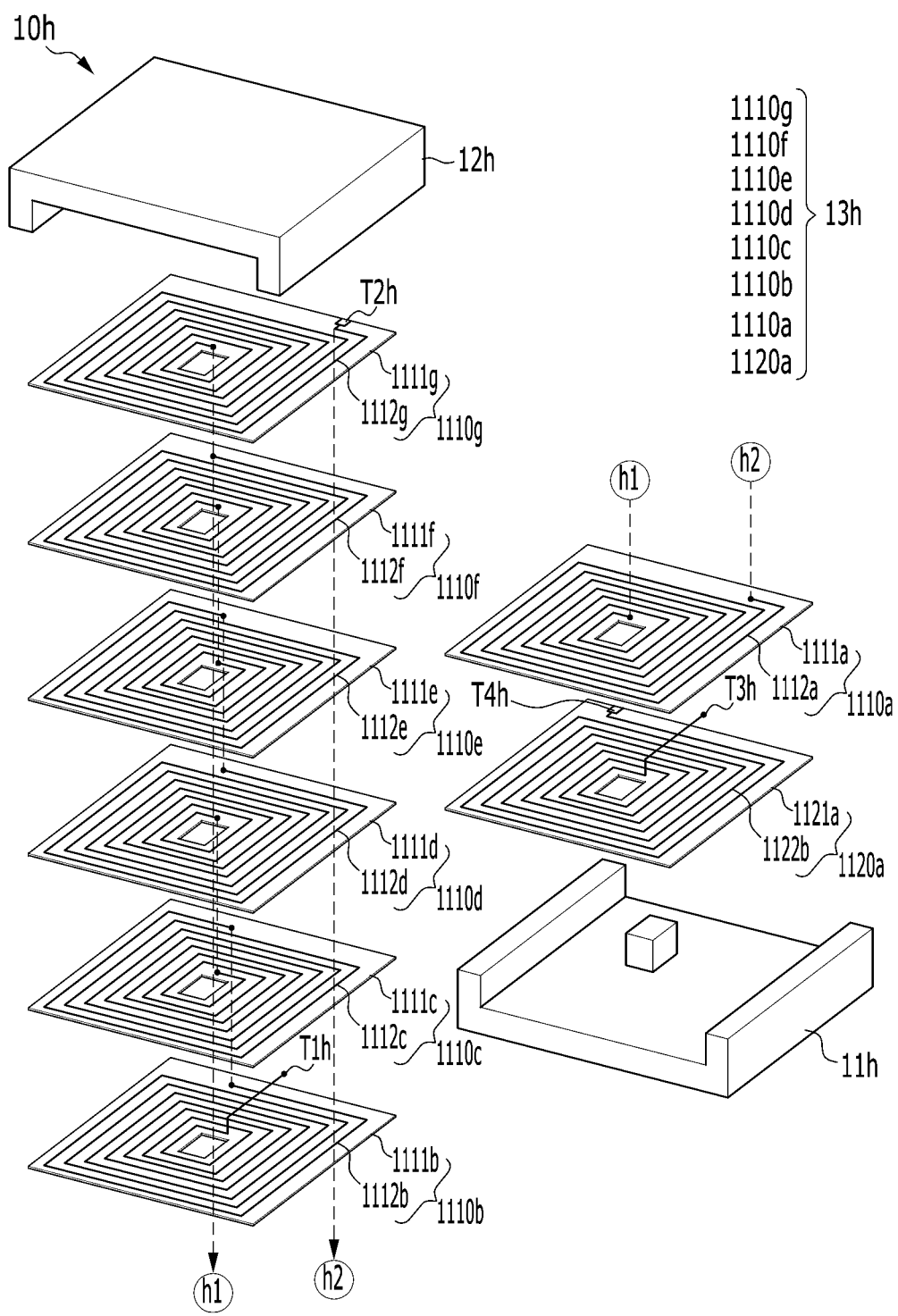
FIG. 11 is a view illustrating a planar magnetic element according to an eighth embodiment.

FIG. 11 is a view illustrating a planar magnetic element according to an eighth embodiment.

Referring to FIG. 11, a planar magnetic element 10h according to an eighth embodiment includes a pair of cores 11h and 12h and a winding unit 13h disposed between the pair of cores 11h and 12h.

The winding unit 13h includes a plurality of main winding layers 1110a to 1110g stacked between the pair of cores 11h and 12h.

The main winding layers 1110a to 1110g include substrates 1111a to 1111g and windings 1112a to 1112g disposed on the substrates 1111a to 1111g, respectively. The windings 1112a to 1112g included in the plurality of main winding layers 1110a to 1110g are connected between a first terminal T1h and a second terminal T2h to form a main winding of the planar magnetic element 10h.

Among the plurality of windings 1112a to 1112g that form the main winding of the planar magnetic element 10h, the two windings 1112a and 1112g connected to the second terminal T2h are connected to each other in parallel, and the remaining windings 1112b to 1112f that form the main winding are connected in series between the two windings 1112a and 1112g connected in parallel and the first terminal T1h.

Among the plurality of main winding layers 1110a to 1110g, the two windings 1112a and 1112g connected in parallel to the second terminal T2h may be disposed at outer portions of the remaining windings 1112b to 1112f. For example, as in FIG. 11, between the two main winding layers 1110a and 1110g including the two windings 1112a and 1112g connected in parallel, the main winding layer 1110b including an end winding 1112b connected to the first terminal T1h and the remaining main winding layers 1110c to 1110f may be disposed.

The winding unit 13h may further include at least one auxiliary winding layer 1120a disposed between the pair of cores 11h and 12h.

The auxiliary winding layer 1120a includes a substrate 1121a and a winding 1122a disposed on the substrate 1121a. The winding 1122a of the auxiliary winding layer 1120a is connected between a third terminal T3h and a fourth terminal T4h to form an auxiliary winding of the planar magnetic element 10h. The auxiliary winding layer 1120a is disposed at an upper portion or a lower portion of the main winding layers 1110a to 1110g.

Although a case in which the planar magnetic element 10h includes seven main winding layers and one auxiliary winding layer is illustrated as an example in FIG. 11, the present disclosure is not limited thereto, and the numbers of main winding layers and auxiliary winding layers that form the planar magnetic element may be modified in various ways. In addition, the thicknesses, the widths, the cross-sectional areas, the numbers of turns, etc. of the windings included in the winding layers that form the planar magnetic element 10h may also be modified in various ways.

According to the eighth embodiment described above, among the windings that form the main winding in the planar magnetic element 10h, the windings connected in parallel to the second terminal T2h are disposed at outer portions of the windings connected to the first terminal T1h. Consequently, even when a switching element is connected to the first terminal T1h, the EMI noise of a winding relatively closely connected to the first terminal T1h is shielded by a winding relatively closely connected to the second terminal T2h in the main winding, and thus the EMI noise of the planar magnetic element 10h may be effectively reduced.

Figure 12:
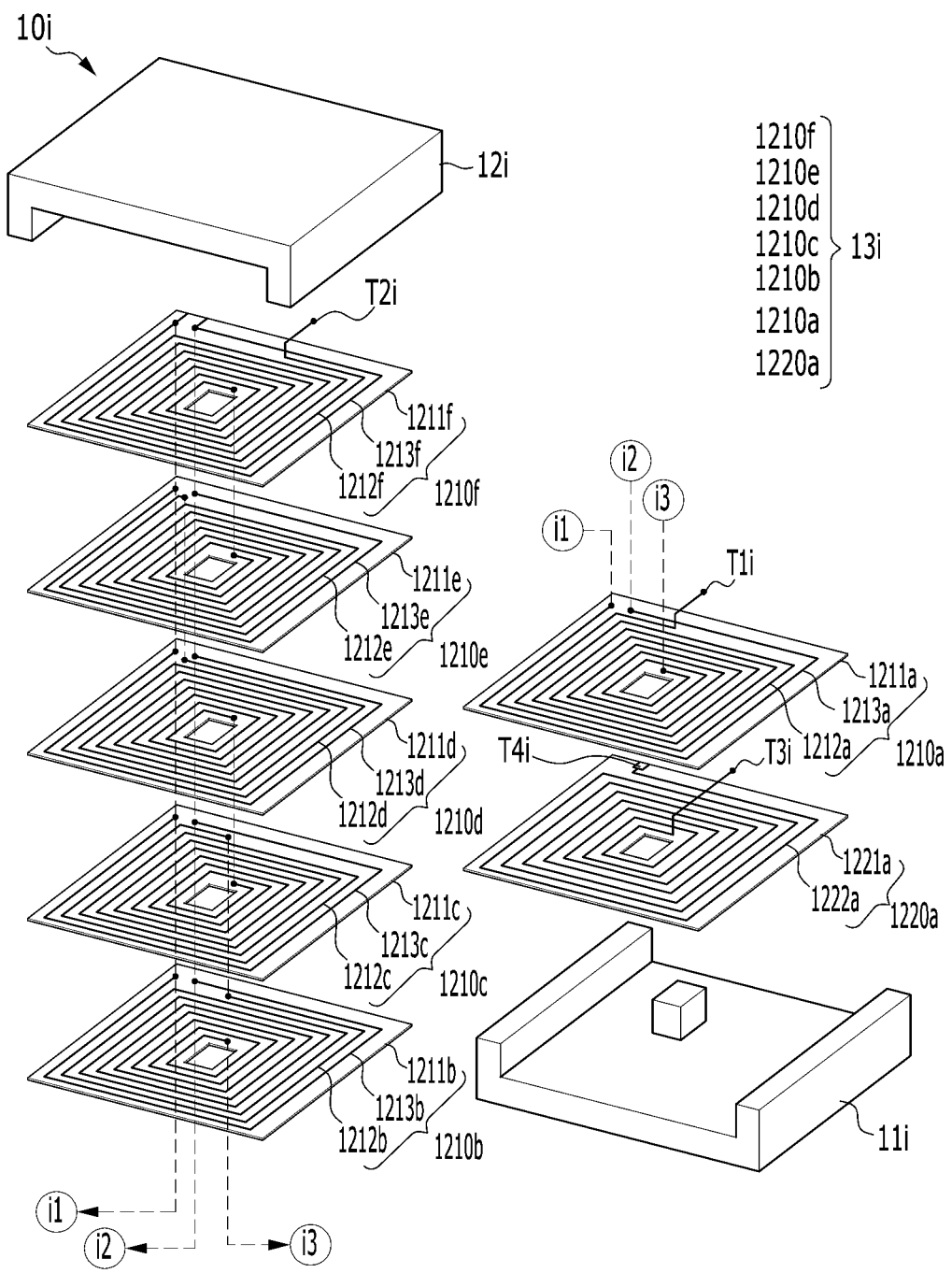
FIG. 12 is a view illustrating a planar magnetic element according to a ninth embodiment.

FIG. 12 is a view illustrating a planar magnetic element according to a ninth embodiment.

Referring to FIG. 12, a planar magnetic element 10i according to a ninth embodiment includes a pair of cores 11i and 12i and a winding unit 13i disposed between the pair of cores 11i and 12i.

The winding unit 13i includes a plurality of main winding layers 1210a to 1210f stacked between the pair of cores 11i and 12i.

The main winding layers 1210a to 1210f include substrates 1211a to 1211f and windings 1212a to 1212f disposed on the substrates 1211a to 1211f, respectively.

The windings 1212a to 1212f included in the main winding layers 1210a to 1210f are connected between a first terminal T1i and a second terminal T2i to form a main winding of the planar magnetic element 10i.

The plurality of main winding layers 1210a to 1210f further include shield patterns 1213a to 1213f. The shield patterns 1213a to 1213f are conductive patterns formed with conductive materials and are connected to a ground terminal. The shield patterns 1213a to 1213g may be disposed at outer portions of the windings 1212a to 1212f on the substrates 1211a to 1211f of the main winding layers 1210a to 1210f. The shield patterns 1213a to 1213f may be formed along outer boundaries of the substrates 1211a to 1211f.

The winding unit 13i may further include an auxiliary winding layer 1220a that forms an auxiliary winding of the planar magnetic element 10i.

The auxiliary winding layer 1220a includes a substrate 1221a and a winding 1222a disposed on the substrate 1221a. The winding 1222a of the auxiliary winding layer 1220a is connected between a third terminal T3i and a fourth terminal T4i to form the auxiliary winding of the planar magnetic element 10i. The auxiliary winding layer 1220a may be disposed at an upper portion or a lower portion of the main winding layers 1210a to 1210f.

Although an example in which the planar magnetic element 10i includes seven main winding layers and one auxiliary winding layer is illustrated as an example in FIG. 12, the present disclosure is not limited thereto, and the numbers of main winding layers and auxiliary winding layers that form the planar magnetic element may be modified in various ways. For example, the planar magnetic element 10i may further include more than one auxiliary winding layer or may be configured without an auxiliary winding layer. In addition, the thicknesses, the widths, the cross-sectional areas, the numbers of turns, etc. of the windings included in the winding layers that form the planar magnetic element 10i may also be modified in various ways.

According to the ninth embodiment described above, shield patterns are disposed at outer portions of the windings that form the main winding in the planar magnetic element 10i. Consequently, even when a switching element is connected to the first terminal T1i, the EMI noise generated at a winding of the main winding is shielded by the shield patterns, and thus the EMI noise of the planar magnetic element 10i may be effectively reduced.

Figure 13:
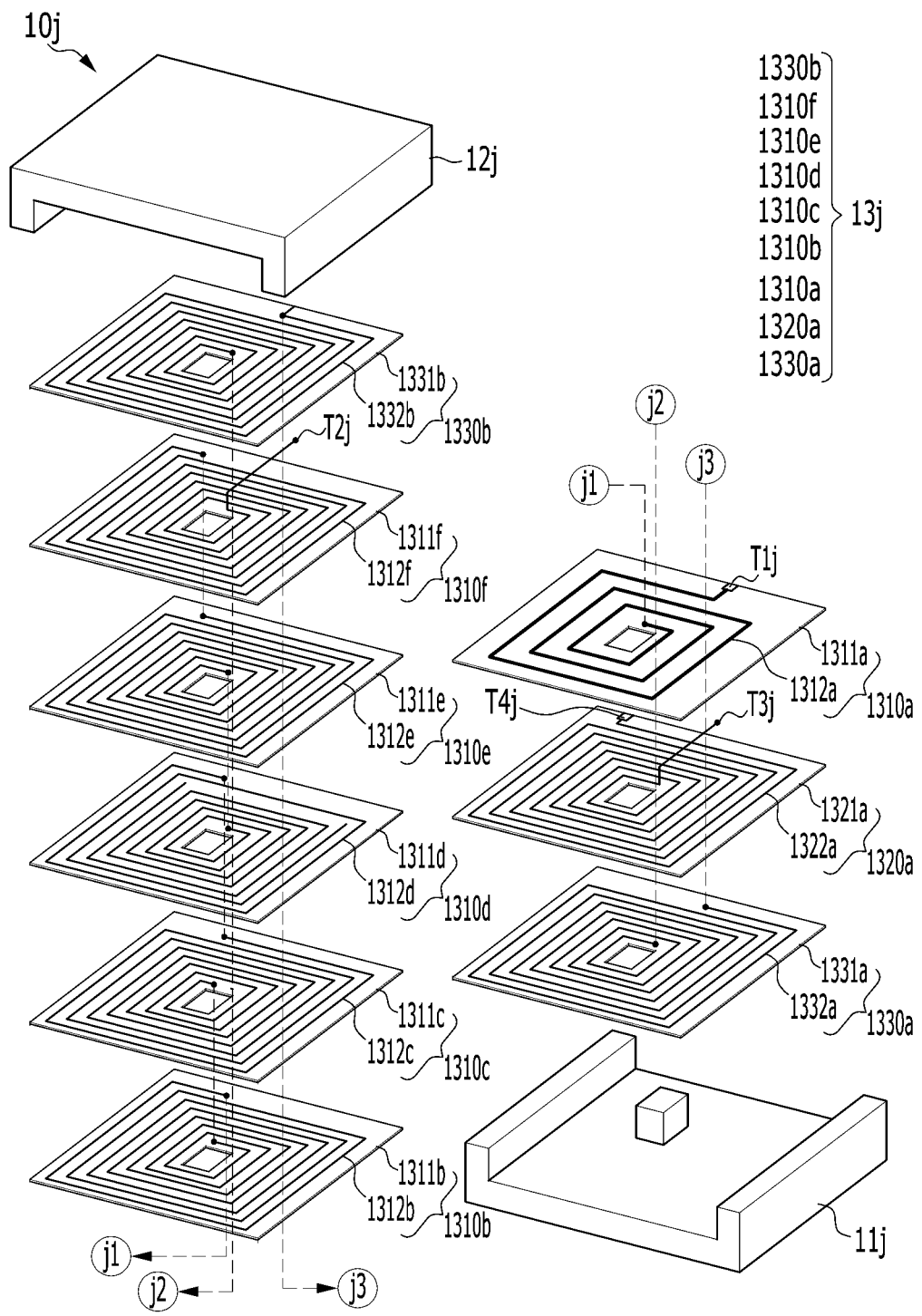
FIG. 13 is a view illustrating a planar magnetic element according to a tenth embodiment.

FIG. 13 is a view illustrating a planar magnetic element according to a tenth embodiment.

Referring to FIG. 13, a planar magnetic element 10j according to a tenth embodiment includes a pair of cores 11j and 12j and a winding unit 13j disposed between the pair of cores 11j and 12j.

The winding unit 13j includes a plurality of shield layers 1330a and 1330b disposed between the pair of cores 11j and 12j.

The shield layers 1330a and 1330b include substrates 1331a and 1331b and shield patterns 1332a and 1332b disposed on the substrates 1331a and 1331 b, respectively.

The substrates 1331a and 1331b of the shield layers 1330a and 1330b are formed with insulating materials and include through-holes H into which legs of the cores 11j and 12j are inserted. The shield patterns 1332a and 1332b of the shield layers 1330a and 1330b are formed with conductive materials and may be connected to a ground terminal. Although a case in which the shield patterns 1332a and 1332b are formed in spiral shapes is illustrated as an example in FIG. 13, the present disclosure is not limited thereto, and the shapes of the shield patterns 1332a and 1332b may be modified in various ways.

The shield layers 1330a and 1330b are dummy winding layers for shielding the EMI noise generated at a winding of the planar magnetic element 10j.

The shield layers 1330a and 1330b may be disposed further outward in the planar magnetic element 10j than main winding layers 1310a to 1310f and an auxiliary winding layer 1320a. Although an example in which the shield patterns 1332a and 1332b of the shield layers 1330a and 1330b are connected to each other in parallel is illustrated as an example in FIG. 13, since the present disclosure is not limited thereto, the shield patterns of the shield layers 1330a and 1330b may also be connected to each other in series or may be configured separately from each other.

The winding unit 13j may further include the plurality of main winding layers 1310a to 1310f stacked between the plurality of shield layers 1330a and 1330b.

The main winding layers 1310a to 1310f include substrates 1311a to 1311f and windings 1312a to 1312f disposed on the substrates 1311a to 1311 f, respectively. The windings 1312a to 1312f disposed on the plurality of main winding layers 1310a to 1310f may be connected between a first terminal T1j and a second terminal T2j to form a main winding of the planar magnetic element 10j.

The windings 1312a to 1312f of the main winding layers 1310a to 1310f are connected to each other in series between the first terminal T1j and the second terminal T2j to form the main winding of the planar magnetic element 10j. Although a case in which the windings 1312a to 1312f that form the main winding are connected to each other in series is illustrated as an example in FIG. 13, since the present disclosure is not limited thereto, at least some windings of the windings 1312a to 1312f that form the main winding may also be connected to each other in parallel.

The winding unit 13j may further include the auxiliary winding layer 1320a disposed between the plurality of shield layers 1330a and 1330b.

The auxiliary winding layer 1320a includes a substrate 1321a and a winding 1322a disposed on the substrate 1321a. The winding 1322a of the auxiliary winding layer 1320a is connected between a third terminal T3j and a fourth terminal T4j to form an auxiliary winding of the planar magnetic element 10j.

The auxiliary winding layer 1320a may be disposed between the main winding layers 1310a to 1310f and the shield layer 1330a.

Although a case in which the planar magnetic element 10j includes six main winding layers, one auxiliary layer, and two shield layers is illustrated as an example in FIG. 13, since the present disclosure is not limited thereto, the numbers of main winding layers, auxiliary winding layers, and shield layers that form the planar magnetic element 10j may be modified in various ways. In addition, the thicknesses, the widths, the cross-sectional areas, the numbers of turns, etc. of the windings included in the winding layers that form the planar magnetic element 10j may also be modified in various ways.

According to the tenth embodiment described above, in the planar magnetic element 10j, the shield layers 1330a and 1330b are disposed at outer portions of the windings of the main winding. Consequently, even when a switching element is connected to the first terminal T1j, the EMI noise generated at a winding of the main winding is shielded by the shield patterns, and thus the EMI noise of the planar magnetic element 10j may be effectively reduced.

Figure 14:
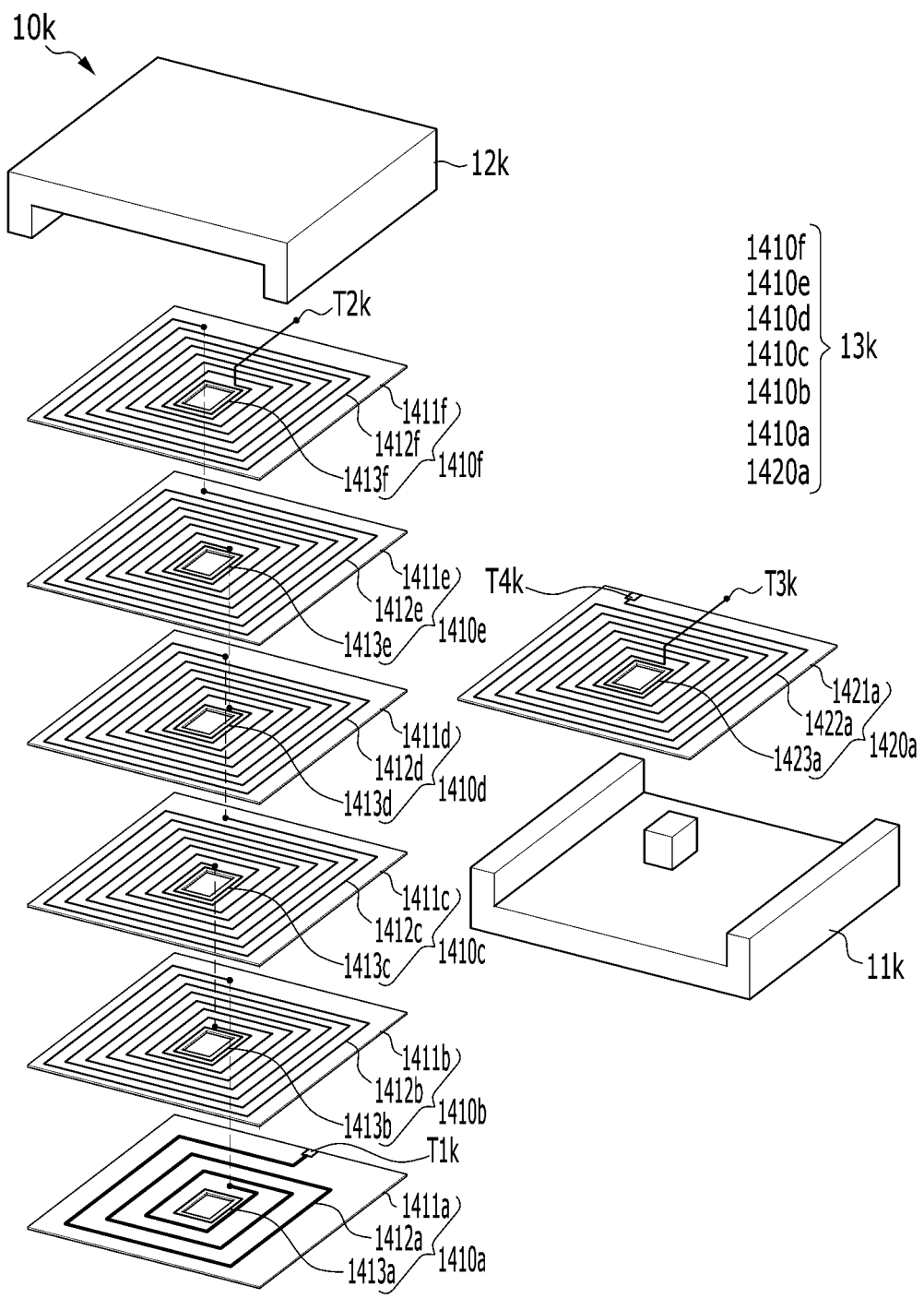
FIG. 14 is a view illustrating a planar magnetic element according to an eleventh embodiment.

FIG. 14 is a view illustrating a planar magnetic element according to an eleventh embodiment.

Referring to FIG. 14, a planar magnetic element 10k according to the eleventh embodiment includes a pair of cores 11k and 12k and a winding unit 13k disposed between the pair of cores 11k and 12k.

The winding unit 13k may include a plurality of main winding layers 1410a to 1410f stacked between the pair of cores 11k and 12k.

The main winding layers 1410a to 1410f include substrates 1411a to 1411f and windings 1412a to 1412f disposed on the substrates 1411a to 1411f, respectively. The windings 1412a to 1412f disposed on the plurality of main winding layers 1410a to 1410f may be connected between a first terminal T1k and a second terminal T2k to form a main winding of the planar magnetic element 10k.

The windings 1412a to 1412f of the main winding layers 1410a to 1410f are connected to each other in series between the first terminal T1k and the second terminal T2k to form the main winding of the planar magnetic element 10k. Although a case in which the windings 1412a to 1412f that form the main winding are connected to each other in series is illustrated as an example in FIG. 14, since the present disclosure is not limited thereto, at least some windings among the windings 1412a to 1412f that form the main winding may also be connected to each other in parallel.

The winding unit 13k may further include an auxiliary winding layer 1420a.

The auxiliary winding layer 1420a includes a substrate 1421a and a winding 1422a disposed on the substrate 1421a. The winding 1422a of the auxiliary winding 1420a is connected between a third terminal T3k and a fourth terminal T4k to form an auxiliary winding of the planar magnetic element 10k.

The auxiliary winding layer 1420a may be disposed at an upper portion or a lower portion of the main winding layers 1410a to 1410f.

The main winding layers 1410a to 1410f and the auxiliary winding layer 1420a may further include flux band patterns 1413a to 1413f and 1423a, respectively.

The flux band patterns 1413a to 1413f and 1423a are formed in the shape of open loop formed around through-holes H to which legs of the cores 11k and 12k are coupled in the substrates 1411a to 1411f and 1421a and may be disposed further inward than the windings 1412a to 1412f and 1422a disposed in the winding layers 1410a to 1410f and 1420a, respectively. Ends of the flux band patterns 1413a to 1413f and 1423a may be in a floating state. The flux band patterns 1413a to 1413f and 1423a may be conductive patterns formed with conductive materials.

According to the eleventh embodiment described above, in the planar magnetic element 10k, the flux band patterns are disposed at central portions of the windings. Consequently, even when a switching element is connected to the first terminal T1k, the EMI noise generated at a winding of the main winding is shielded by the flux band patterns, and thus the EMI noise of from the planar magnetic element 10k may be effectively reduced.

Meanwhile, although the cases in which the planar magnetic elements 10a to 10k include only one main winding have been illustrated as an example in the embodiments described above, the present disclosure is not limited thereto. As mentioned above, when a planar magnetic element is a transformer, the planar magnetic elements 10a to 10k may further include a main winding disposed at a second side. In this case, the main winding described by the embodiments may be a configuration including the first-side winding unit 101 and the auxiliary winding unit 103, and the additionally included main winding may be a configuration corresponding to the second-side winding unit 102.

The main winding at the second side may include at least one winding layer, and the at least one winding layer may be disposed at an upper portion or a lower portion of winding layers that form the main winding at the first side.

Embodiments of the present disclosure have been described in detail above but the scope of the present disclosure is not limited thereto, and various modifications and improvements made by those of ordinary skill in the art using a basic concept of the present disclosure defined by the following claims should also be deemed as belonging to the scope of the present disclosure.

DESCRIPTION OF SYMBOLS 1-3: SMPS
10, 10a-10k: Planar magnetic element
11, 11a-11k, 12, 12a-12k: Core
13, 13a-13k: Winding unit

What is claimed is:

1. A planar magnetic element coupled to a switching element, comprising:
   a pair of cores;
   a plurality of first winding layers disposed between the pair of cores, and comprising a plurality of first substrates and a plurality of first windings respectively patterned on the plurality of first substrates, the plurality of first windings coupled between a first terminal and a second terminal, the first terminal being connected to the switching element; and
   a plurality of second winding layers disposed between the pair of cores, and comprising a plurality of second substrates and a plurality of second windings respectively patterned on the plurality of second substrates, the plurality of second windings coupled between a third terminal and a fourth terminal,
   wherein the plurality of first winding layers are disposed between the plurality of second winding layers,
   wherein the plurality of first windings are included in a primary winding of the planar magnetic element, and the plurality of second windings are included in an auxiliary winding of the planar magnetic element,
   wherein the first to fourth terminals are different and separated from each other without being directly connected to each other,
   wherein the plurality of first windings includes a first main winding having a first end directly connected to the switching element through the first terminal, a second main winding having a first end directly connected to the second terminal to which an input voltage of the planar magnetic element is supplied, a second end of the first main winding being coupled to a second end of the second main winding,
   wherein the plurality of second windings have a smaller pulsation of voltage than the first main winding,
   wherein the planar magnetic element further comprises a secondary winding that is separated from the primary winding and the auxiliary winding, and the primary winding forms a transformer with the secondary winding, and
   wherein the first main winding directly connected to the switching element through the first terminal is thicker than the other windings in the primary winding.

2. The planar magnetic element of claim 1, wherein the plurality of second windings included in the plurality of second winding layers are coupled to each other in parallel, and the third terminal and the fourth terminal are respectively connected to two ends of one end second winding among the plurality of second windings.

3. The planar magnetic element of claim 1, wherein the plurality of second windings included in the plurality of second winding layers are coupled to each other in series, and the third terminal and the fourth terminal are respectively connected to two end second windings among the plurality of second windings.

4. The planar magnetic element of claim 1, wherein the third terminal is coupled to an input terminal of a circuit for controlling the switching element and the fourth terminal is coupled to a ground terminal.

5. The planar magnetic element of claim 1,
wherein the first main winding has one or more of a thickness, a cross-sectional area, and a number of turns, which are different from those of the second winding.

6. The planar magnetic element of claim 5, wherein the first main winding directly connected to the switching element through the first terminal has a smaller winding number than the other windings in the primary winding.

7. A planar magnetic element coupled to a switching element, comprising:
a first core;
a second core;
a first winding layer having a first substrate and a first winding patterned on the first substrate, the first winding having a first end connected to a first terminal and a second end connected to a fourth terminal;
a second winding layer having a second substrate and a second winding patterned on the second substrate, the second winding being connected to the first winding, wherein the first winding layer and the second winding layer are stacked between the first core and the second core;
a third winding layer having a third substrate and a third winding patterned on the third substrate, the third winding being connected to a second terminal; and
a fourth winding layer having a fourth substrate and a fourth winding patterned on the fourth substrate, the fourth winding being connected between the third winding and a third terminal that is connected to the switching element, wherein the third winding layer and the fourth winding layer are stacked between the first winding layer and the second winding layer,
wherein the first winding and the second winding are included in an auxiliary winding of the planar magnetic element, and the third winding and the fourth winding are included in a primary winding of the planar magnetic element,
wherein the first to fourth terminals are different and separated from each other without being directly connected to each other,
wherein the first and second windings have a smaller pulsation of voltage than the fourth winding that is connected to the switching element through the third terminal,
wherein the planar magnetic element further comprises a secondary winding that is separated from the primary winding and the auxiliary winding, and the primary winding forms a transformer with the secondary winding, and
wherein the fourth winding directly connected to the switching element through the third terminal is thicker than the other windings in the primary winding.

8. The planar magnetic element of claim 7, further comprising:
a fifth winding layer having a fifth substrate and a fifth winding, the fifth winding having a first end connected to the third winding and a second end connected to the fourth winding, wherein the fifth winding layer is stacked between the third winding layer and the fourth winding layer.

9. The planar magnetic element of claim 7, wherein the first, second, third, and fourth winding layers include a through-hole through which legs of the first core and the second core are inserted.

10. The planar magnetic element of claim 7, wherein a first end of the second winding is connected to the first terminal and a second end of the second winding is connected to the fourth terminal.

11. The planar magnetic element of claim 7, wherein the fourth winding has one or more of a thickness, a cross-sectional area, and a number of turns, which are different from those of the other windings of the primary winding.

12. The planar magnetic element of claim 11, wherein the fourth winding connected to the switching element through the third terminal has a smaller winding number than the other windings in the primary winding.

* * * * *